United States Patent
Nakayama et al.

(10) Patent No.: US 7,630,426 B2
(45) Date of Patent: Dec. 8, 2009

(54) WAVELENGTH DETECTOR, WAVELENGTH STABILIZATION LASER DEVICE, AND IMAGE DISPLAY DEVICE

(75) Inventors: Kenji Nakayama, Osaka (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/048,561

(22) Filed: Mar. 14, 2008

(65) Prior Publication Data

US 2008/0225911 A1      Sep. 18, 2008

(30) Foreign Application Priority Data

Mar. 16, 2007    (JP) .............................. 2007-068398

(51) Int. Cl.
*H01S 3/08* (2006.01)
(52) U.S. Cl. .................. 372/102; 372/99; 372/29.011
(58) Field of Classification Search .............. 372/102, 372/99
See application file for complete search history.

(56) References Cited

U.S. PATENT DOCUMENTS 5,691,989 A * 11/1997 Rakuljic et al. ............ 372/20

FOREIGN PATENT DOCUMENTS

| JP | 62-5677 | 1/1987 |
|---|---|---|
| JP | 2006-32397 | 2/2006 |
| JP | 2006-324371 | 11/2006 |

\* cited by examiner

*Primary Examiner*—Dung T Nguyen
(74) *Attorney, Agent, or Firm*—Wenderoth, Lind & Ponack, L.L.P.

(57) ABSTRACT

A wavelength detector detecting a change of a wavelength of a laser light with high accuracy, such that the wavelength detector includes a diffraction grating diffracting a laser light, photodetectors positioned symmetrically with respect to a 0-order diffracted light diffracted by the diffraction grating, and respective light incidence surfaces of the photodetectors that have a same shape and that are divided into a plurality of areas. The wavelength detector detects the change of the wavelength based on a value obtained by dividing a difference between (i) a sum of light intensities measured by all of the plurality of divided areas of a first photodetector and (ii) a sum of light intensities measured by all of the plurality of divided areas of a second photodetector, by a sum of light intensities measured by all of the plurality of divided areas of both photodetectors.

14 Claims, 21 Drawing Sheets

F I G. 8
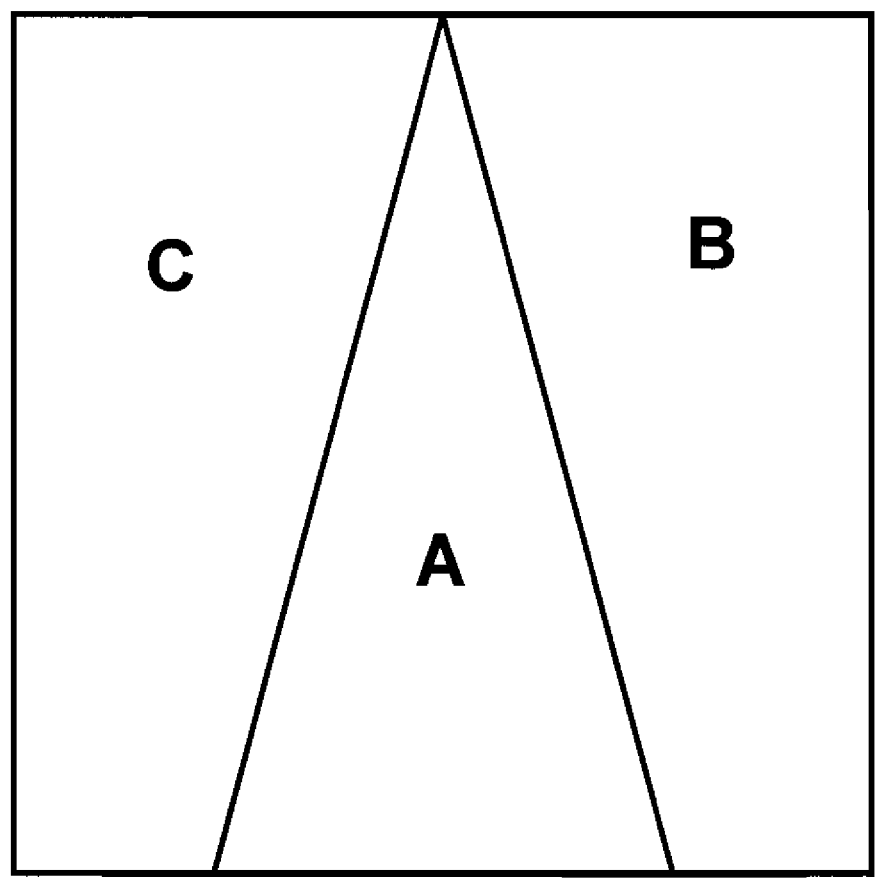

FIG. 11
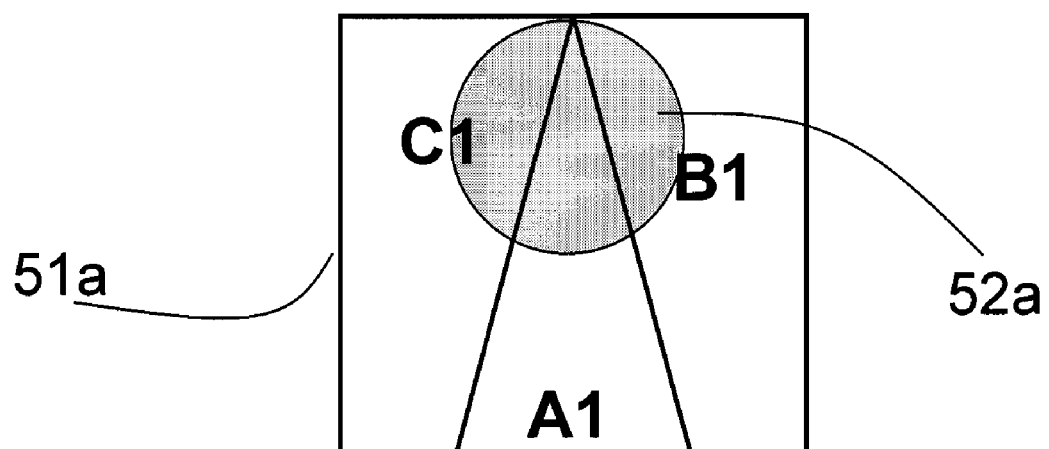
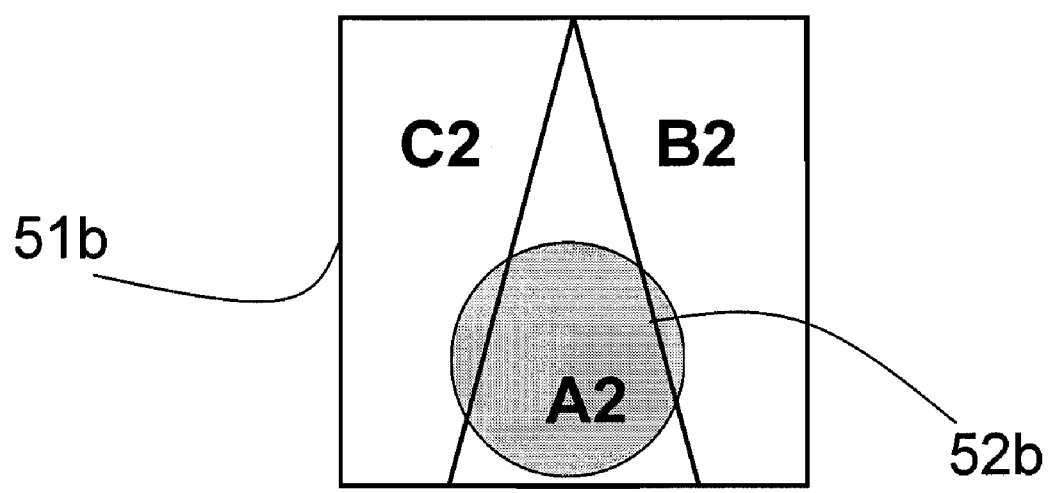

WAVELENGTH DETECTOR, WAVELENGTH STABILIZATION LASER DEVICE, AND IMAGE DISPLAY DEVICE

BACKGROUND OF THE INVENTION

1. Field of the Invention

The present invention relates to a wavelength detector, a wavelength stabilization laser device, and an image display device, and particularly to a wavelength detector capable of distinguishing between the changes of a transverse mode and of a longitudinal mode of a laser light and thus detecting the change of the wavelength of the laser light, to a wavelength stabilization laser device using the wavelength detector, and to an image display device using the laser light generated by the wavelength stabilization laser device as a light source.

2. Description of the Related Art

In recent years, an image display device using laser light sources attracts attention. Since a laser light is a coherent light, the width (spectral width) of the wavelength of the laser light is extremely narrow. Since the wavelength determines a color, the laser light has excellent monochromaticity. The wavelengths of the laser light sources may be appropriately selected, whereby it is possible to realize an image display device having high color purity of three primary colors of light: R (red), G (green), and B (blue), and also having high color reproducibility. When the wavelengths change, the color of an image changes naturally. Therefore, a method for detecting the changes of the wavelengths and a method for stabilizing the wavelengths are very important in the image display device using the laser light sources.

Next, a conventional wavelength detector using a diffracted light will be described. FIG. 21 is a schematic diagram showing an example of a conventional wavelength detector 114 using a diffracted light. Referring to FIG. 21, the wavelength detector 114 includes a diffraction grating 111 for diffracting a laser light emerging from a laser light source 110, and also includes a photodetector 130 for measuring a +1-order diffracted light. The laser light outputted from the laser light source 110 is incident on the wavelength detector 114 provided in the light path of the laser light. In the wavelength detector 114, the laser light incident thereon is diffracted by the diffraction grating 111, and the diffracted laser lights interfere with one another and thus generate In-order diffracted lights 120. A light incidence surface of the photodetector 130 for measuring the +1-order diffracted light is designed to be equal to or smaller than a beam spot of the laser light in size.

The photodetector 130 is mechanically movable so as to move to a position at which the measured value of the light intensity of the +1-order diffracted light is great. Here, the position of the photodetector 130, at which the measured value of the light intensity of the +1-order diffracted light is great, is a position at which the beam spot is included within the light incidence surface of the photodetector 130. The wavelength detector 114 can recognize the position of the beam spot of the +1-order diffracted light by moving the photodetector 130 while observing the measured value of the light intensity of the +1-order diffracted light. Thus, based on the position of the beam spot, it is possible to obtain a diffraction angle $\theta_1$ of the +1-order diffracted light with respect to a 0-order diffracted light in a fundamental mode. Since the diffraction angle $\theta_1$ of the +1-order diffracted light with respect to the 0-order diffracted light in the fundamental mode corresponds to the wavelength of the laser light, the wavelength detector 114 can detect the change of the wavelength of the laser light based on the change of the diffraction angle $\theta_1$ of the +1-order diffracted light.

Note that the conventional wavelength detector 114 can similarly detect the change of the wavelength of the laser light also by fixing the photodetector 130 and moving the diffraction grating 111. Further, the conventional wavelength detector 114 can similarly detect the change of the wavelength of the laser light also by fixing the photodetector 130 and dividing the light incidence surface of the photodetector 130 into an array. In this case, the wavelength detector 114 calculates the diffraction angle $\theta_1$ of the +1-order diffracted light based on the values of the light intensities measured separately by all of the divided areas of the light incidence surface, whereby the wavelength detector 114 can detect the change of the wavelength of the laser light based on the calculated diffraction angle $\theta_1$.

Further, the following publications each disclose a semiconductor laser light source applying the method of the conventional wavelength detector 114. A semiconductor laser light source disclosed in Japanese Examined Patent Publication No. 62-005677 (hereinafter referred to as Patent Document 1) detects the change of the wavelength of a laser light by causing a position sensitive detector to detect a +2 diffracted light diffracted by a diffraction grating and thus obtaining the diffraction angle of the +2 diffracted light. Additionally, the semiconductor laser light source disclosed in Patent Document 1 measures laser power by causing a photodetector to detect a 0-order diffracted light and feeds a +1-order diffracted light back to a semiconductor laser. The semiconductor laser light source disclosed in Patent Document 1 concurrently measures the change of the wavelength of the laser light and the laser power, thereby realizing a stable operation in which the change of the wavelength is small.

Further, a semiconductor laser light source disclosed in Japanese Laid-Open Patent Publication No. 2006-32397 (hereinafter referred to as Patent Document 2) detects the change of the wavelength of a laser light by causing a position sensitive detector to measure a +1-order diffracted light and thus obtain the diffraction angle of the +1-order diffracted light. Then, the semiconductor laser light source disclosed in Patent Document 2 controls laser power based on the change of the wavelength of the laser light, thereby realizing a stable operation in which the change of the wavelength is small.

Further, a semiconductor laser light source disclosed in Japanese Laid-Open Patent Publication No. 2006-324371 (hereinafter referred to as Patent Document 3) inserts, taking advantage of an oval beam shape of a laser light emerging from a semiconductor laser, an optical device for reducing a beam diameter in a longitudinal direction, when causing a position sensitive detector to measure a +1-order diffracted light, thereby improving the accuracy of detecting the change of the wavelength of the laser light.

However, a laser light has two types of changes of modes: the change of a longitudinal mode and the change of a transverse mode. The change of the longitudinal mode is the change of a wavelength. That is, detecting a wavelength is measuring the state of the longitudinal mode. On the other hand, the change of the transverse mode is the change of the intensity distribution of beam cross-sections. The above-described wavelength detector 114 and the semiconductor laser light sources disclosed in Patent Documents 1 through 3 each merely measure the state of the longitudinal mode of the laser light without taking the change of the transverse mode into account.

Generally, when the transverse mode is in a fundamental mode (a single transverse mode), the intensity distribution of beam cross-sections is a Gaussian distribution (a normal distribution). When the transverse mode changes, the Gaussian distribution changes and the positions of the beam spots of the laser lights change. That is, since none of the conventional wavelength detector 114 and the semiconductor laser light sources disclosed in Patent Documents 1 through 3 take the change of the transverse mode into account, an error may be caused in wavelength detection when the transverse mode changes.

With reference to the conventional wavelength detector 114, the above-described wavelength detection error caused in the case where the transverse mode changes will be described. First, it is assumed that as shown in FIG. 21, the +1-order diffracted light of the diffraction angle $\theta 1$ is generated in the conventional wavelength detector 114. FIG. 22 shows a state where the transverse mode is constant and the longitudinal mode changes from the above-described state. As shown in FIG. 22, when the longitudinal mode changes, the diffraction angle of the +1-order diffracted light changes naturally, and thus $\theta 1+\Delta\theta$. As a result, the wavelength detector 114 moves the photodetector 130 upward so as to move the light incidence surface of the photodetector 130 to the position of the beam spot of the +1-order diffracted light.

Next, FIG. 23 shows a state where the longitudinal mode is constant and the transverse mode changes. As shown in FIG. 23, as a result of the change of the transverse mode, the position of the beam spot shifts upward. That is, since the +1-order diffracted light shifts upward naturally, the light incidence surface of the photodetector 130 shifts upward. The position of the photodetector 130 in this case is the same as the position of the photodetector 130 measuring the +1-order diffracted light in FIG. 22. Consequently, the wavelength detector 114 cannot distinguish between the state where the longitudinal mode changes (FIG. 22) and the state where the transverse mode changes (FIG. 23). That is, the conventional wavelength detector 114 recognizes even the change of the transverse mode as the change of the longitudinal mode, and thus an error may be caused in wavelength detection of the laser light.

Further, when the image display device uses the laser light sources, it is required to improve the efficiency of the laser light and the output of the laser light to realize the image display device having a higher brightness. However, the greater the output of the laser light, the more likely the changes of the modes of the laser light occur. As an example, when the laser light sources are used as a backlight of a 37-inch liquid crystal television, each color of R, G, and B requires a more-than-3W laser light source in view of efficiency and the like. To realize a sharper image regardless of the changes of the modes, a high-accuracy wavelength detector is necessary.

Further, in the laser light sources used for the image display device, a laser light is scanned optically or mechanically and thus expanded to be projected onto a screen. Furthermore, to realize a liquid crystal backlight using a planar lighting device having laser light sources, a method is known for expanding a laser light and thus making the laser light incident on a light guide plate. To improve the accuracy of wavelength detection of the laser light expanded in the above-described manner, general methods may include one for providing an aperture to reduce the effect of the expansion of the laser light, another for using a lens to concentrate the laser light into a narrow beam and thus measuring the narrow beam, and the like. However, when the aperture is provided, the light intensity of the laser light to be measured is reduced. Moreover, the method for using the lens to converge the laser light requires an optical system provided in accordance with the state of the laser light, and thus complicates the device.

BRIEF SUMMARY OF THE INVENTION

Therefore, an object of the present invention is to provide a wavelength detector capable of distinguishing between the changes of a transverse mode and of a longitudinal mode of a laser light and thus detecting the change of the wavelength of the laser light with high accuracy, a wavelength stabilization laser device using the wavelength detector, and an image display device using the laser light generated by the wavelength stabilization laser device as a light source.

The present invention is directed to a wavelength detector for detecting a change of a wavelength of a laser light emerging from a laser light source. To achieve the above object, the wavelength detector of the present invention includes a diffraction grating for diffracting the laser light, and at least two photodetectors positioned symmetrically with respect to a 0-order diffracted light diffracted by the diffraction grating. The wavelength detector detects the change of the wavelength of the laser light based on light intensities of ±n-order (n is an integer equal to or greater than 1) diffracted lights measured by the two photodetectors.

It is preferable that the two photodetectors measure ±1-order diffracted lights.

It is preferable that the two photodetectors measure diffraction angles of the ±n-order diffracted lights with respect to the 0-order diffracted light by moving to positions for maximizing the light intensities of the ±n-order diffracted lights. In this case, the wavelength detector detects the change of the wavelength of the laser light based on an average angle of the diffraction angles of the ±n-order diffracted lights measured by the two photodetectors.

Further, light incidence surfaces of the two photodetectors may be divided into light incidence areas and light blocking areas by masks for blocking lights. In this case, the light incidence areas each have a shape which is symmetrical with respect to a straight line orthogonal to the 0-order diffracted light and passing through the light incidence surfaces and which includes certain slopes to the straight line. The wavelength detector detects the change of the wavelength of the laser light based on a difference value between the light intensities measured by the two photodetectors.

Further, the masks provided on the light incidence surfaces of the two photodetectors may be movable so as to change areas of the light incidence areas in accordance with beam shapes of the ±n-order diffracted lights.

The wavelength detector may further include lenses, in front of the two photodetectors, for increasing beam diameters of the ±n-order diffracted lights.

Further, light incidence surfaces of the two photodetectors may have the same shape and each may be divided into a plurality of areas. In this case, the wavelength detector detects the change of the wavelength of the laser light based on a value obtained by dividing a difference value between a sum of light intensities measured by all of the plurality of divided areas of one of the two photodetectors and a sum of light intensities measured by all of the plurality of divided areas of the other of the two photodetectors, by a sum of light intensities measured by all of the plurality of divided areas of the two photodetectors.

It is preferable that the light incidence surfaces of the two photodetectors are each divided into a shape which is symmetrical with respect to a straight line orthogonal to the 0-order diffracted light and which includes certain slopes to the straight line. Further, beam shapes of the ±n-order diffracted lights are each rectangular.

Further, the present invention is also directed to a wavelength stabilization laser device. The wavelength stabilization laser device of the present invention includes: a laser light source for generating a laser light; the above-described wavelength detector for detecting a change of a wavelength of the laser light generated by the laser light source; and a wavelength control device for controlling the laser light source based on the change of the wavelength detected by the wavelength detector.

It is preferable that the wavelength control device controls a temperature of the laser light source such that the wavelength of the laser light is constant.

Further, the wavelength control device may control an output from the laser light source such that the wavelength of the laser light is constant.

Further, the present invention is also directed to an image display device. The image display device of the present invention includes the above-described wavelength stabilization laser device as at least one light source. Furthermore, an image display device of the present invention may include the above-described wavelength detector as at least one light source, and may control, in accordance with a wavelength of the laser light detected by the wavelength detector, power of the laser light so as to prevent a color tone of an image displayed by the image display device from changing.

As described above, based on the wavelength detector according to the present invention, the change of the wavelength of the laser light is detected based on the light intensities of the ±1-order diffracted lights measured by the two photodetectors positioned symmetrically with respect to the 0-order diffracted light, whereby it is possible to distinguish between the changes of the transverse mode and of the longitudinal mode of the laser light and thus is possible to detect the change of the wavelength of the laser light.

The wavelength detector according to the present invention is applicable to a wavelength stabilization laser device and the like used as a light source of an image display device and the like.

Further, based on the wavelength stabilization laser device according to the present invention, the wavelength control device controls the laser light source based on the change of the wavelength of the laser light detected by the above-described wavelength detector, whereby it is possible to distinguish between the changes of the transverse mode and of the longitudinal mode of the laser light and thus is possible to realize the laser light source having a constant wavelength.

Further, based on the image display device according to the present invention, it is possible to realize image display having high color reproducibility by using the above-described wavelength stabilization laser device as a light source.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing an example of a photodetector having a light incidence surface divided into three areas;

FIG. 11 is a diagram showing the light incidence surfaces 51a and 51b of the photodetectors in the case where the longitudinal mode changes;

DETAILED DESCRIPTION OF THE INVENTION

With reference to the drawings, each embodiment of the present invention will be described below.

FIRST EMBODIMENT

Figure 1:
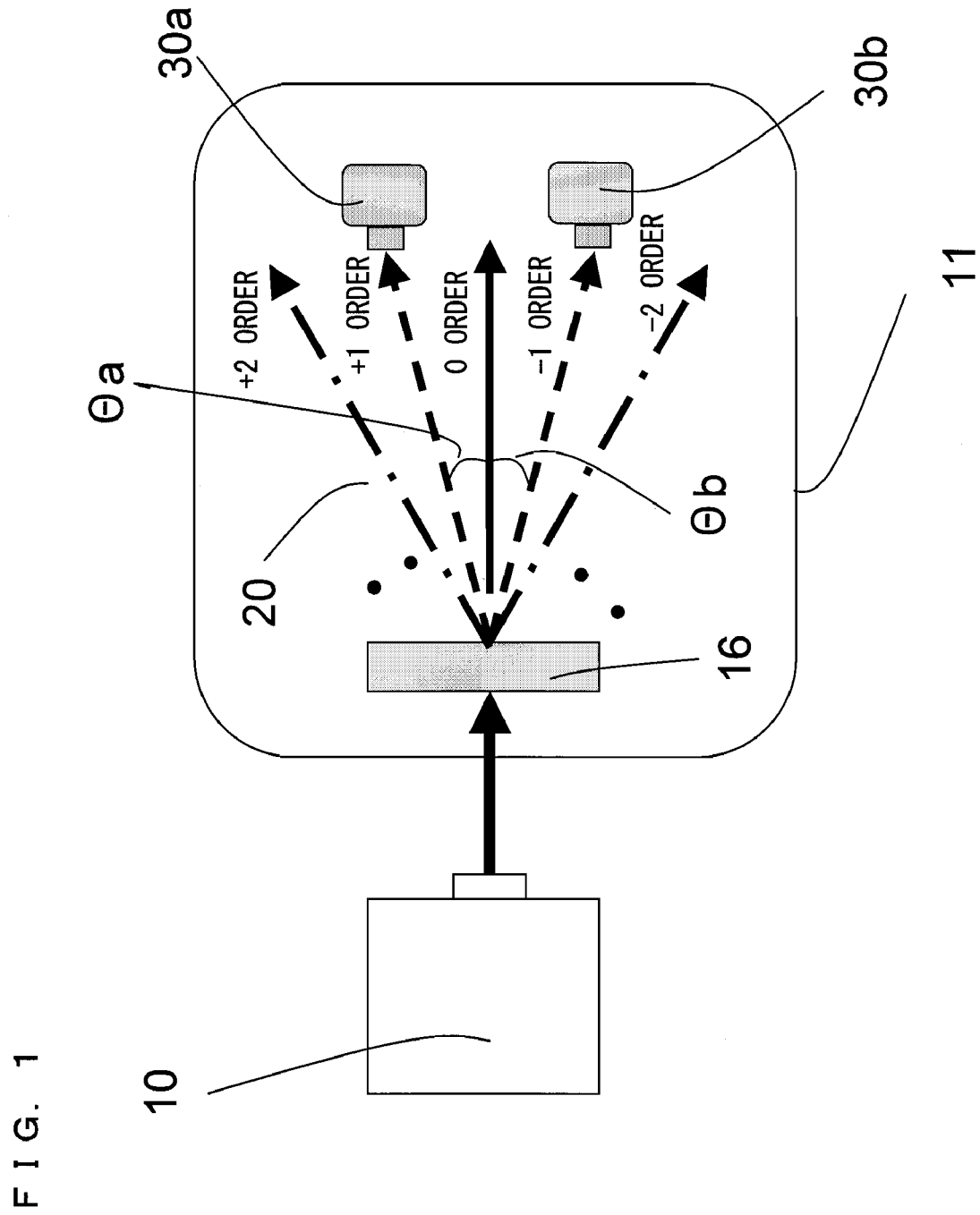
FIG. 1 is a schematic diagram showing an example structure of a wavelength detector 11 according to a first embodiment of the present invention.

FIG. 1 is a schematic diagram showing an example structure of a wavelength detector 11 according to a first embodiment of the present invention. Referring to FIG. 1, the wavelength detector 11 includes a diffraction grating 16 for diffracting a laser light emerging from a laser light source 10, and also includes at least two photodetectors 30a and 30b which measure a +n-order diffracted light and a −n-order diffracted light, respectively (n is an integer equal to or greater than 1). The laser light emerging from the laser light source 10 is incident on the wavelength detector 11 provided in the light path of the laser light. In the wavelength detector 11, the laser light incident thereon is diffracted by the diffraction grating 16, and the diffracted laser lights interfere with one another and thus generate ±n-order diffracted lights 20. Light incidence surfaces of the photodetectors 30a and 30b which measure the diffracted lights 20 are each designed to be equal to or smaller than the beam diameter of the laser light.

The photodetectors 30a and 30b are mechanically movable so as to move to the positions for maximizing the measured values of the light intensities of the diffracted lights 20. Here, the positions of the photodetectors 30a and 30b which maximize the measured values of the light intensities of the diffracted lights 20 are the positions at which the beam spots of the diffracted lights 20 are included within the light incidence surfaces of the photodetectors 30a and 30b. In this example, the photodetectors 30a and 30b measure a +1-order diffracted light and a −1-order diffracted light, respectively. Therefore, the photodetector 30a moves to the position (i.e., the position for maximizing the light intensity of the +1-order diffracted light) of the beam spot of the +1-order diffracted light. On the other hand, the photodetector 30b moves to the position (i.e., the position for maximizing the light intensity of the −1-order diffracted light) of the beam spot of the −1-order diffracted light.

As described above, the wavelength detector 11 can recognize the positions of the beam spots of the +1-order diffracted light and the −1-order diffracted light by moving the photodetectors 30a and 30b, respectively, to the positions for maximizing the measured values of the light intensities of the diffracted lights 20. Then, based on the positions of the beam spots of the +1-order diffracted light and the −1-order diffracted light, the wavelength detector 11 can calculate an angle θa and an angle θb, respectively, both with respect to a 0-order diffracted light in a fundamental mode.

Figure 22:
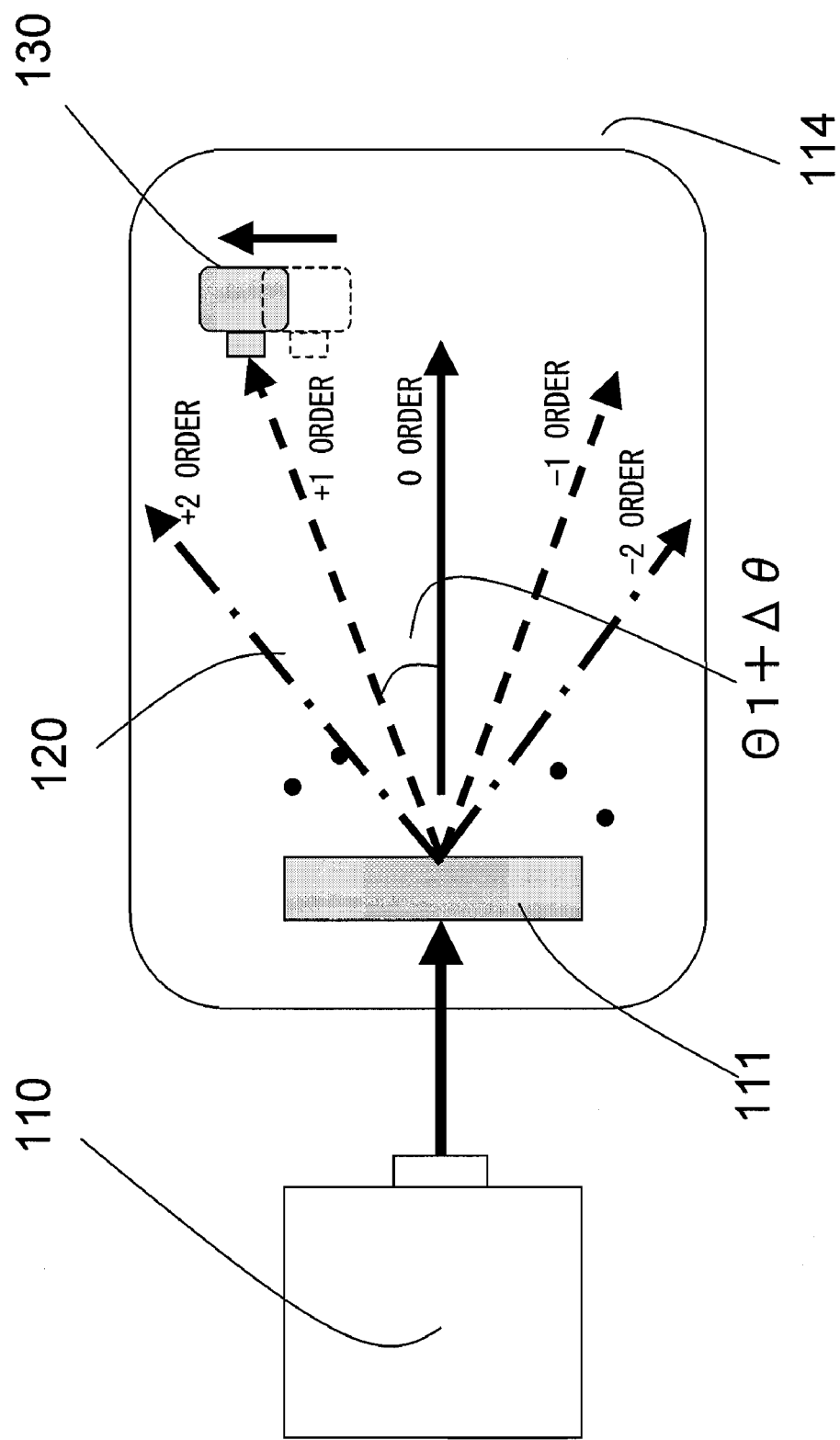
FIG. 22 is a diagram showing a state of the conventional wavelength detector 114 in the case where the longitudinal mode changes.
Figure 23:
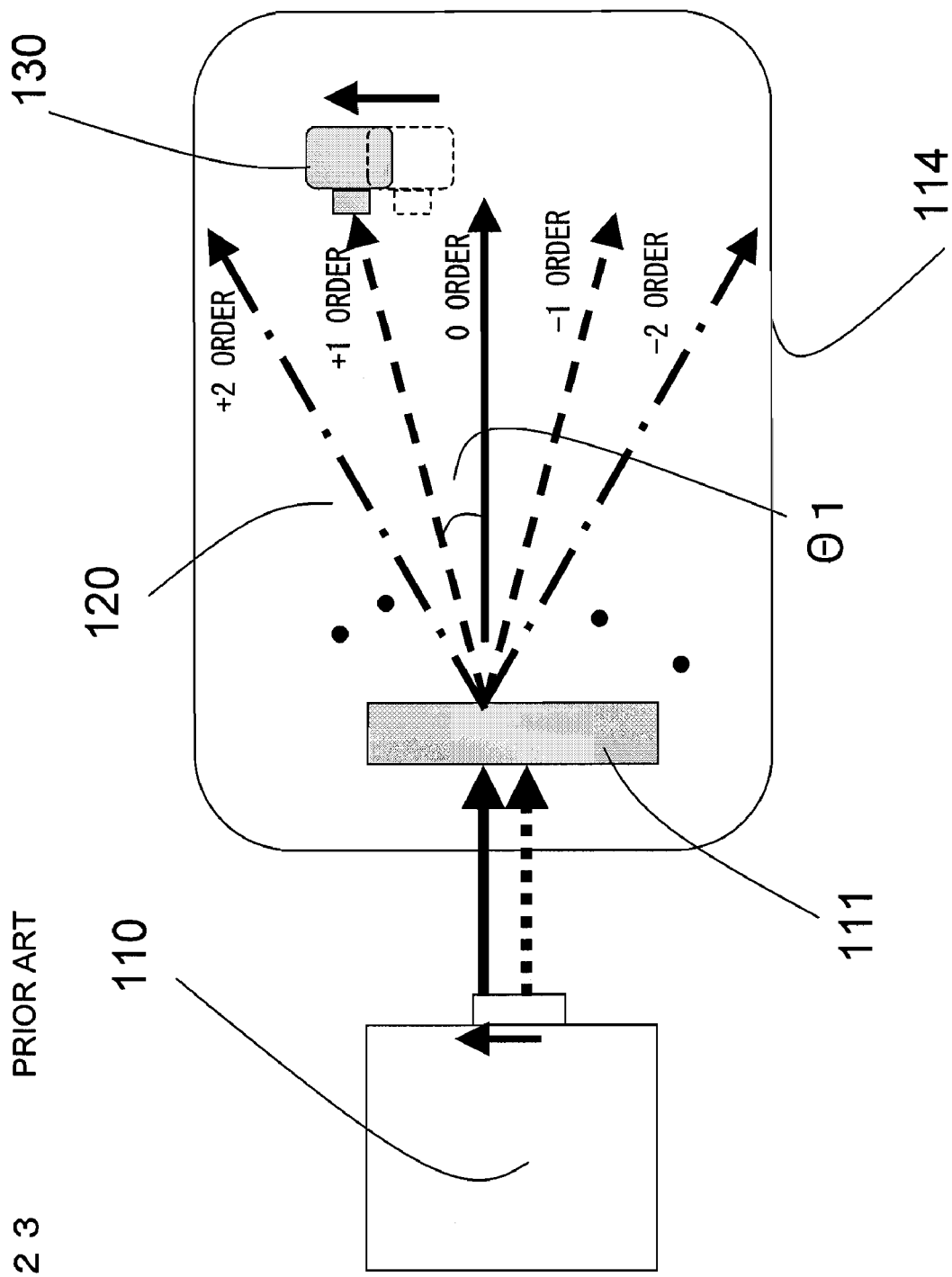
FIG. 23 is a diagram showing a state of the conventional wavelength detector 114 in the case where the transverse mode changes.

Next, a method for detecting the wavelength of the laser light taking into account not only the change of the transverse mode but also the change of the longitudinal mode of the laser light, using the angles θa and θb which are measured by the photodetectors 30a and 30b, respectively, will be described. As described above in the Description of the Background Art, when the longitudinal mode changes (i.e., when the wavelength of the laser light changes), diffraction angles change as shown in FIG. 22. Further, since the diffraction angles of diffracted lights having the same order on an absolute-value basis are equal to each other, the diffraction angles of the +1-order diffracted light and the −1-order diffracted light are equal to each other. Therefore, when the longitudinal mode changes, the position of the beam spot of the +1-order diffracted light and the position of the beam spot of the −1-order diffracted light move symmetrically with respect to the 0-order diffracted light. Thus, as shown in FIG. 1, when the transverse mode is in the fundamental mode, the angles θa and θb which are measured by the photodetectors 30a and 30b are the same as the diffraction angles of the ±1-order diffracted lights, respectively, and have a relationship of (equation 1).

$$\theta a = \theta b \quad \text{(equation 1)}$$

Figure 2:
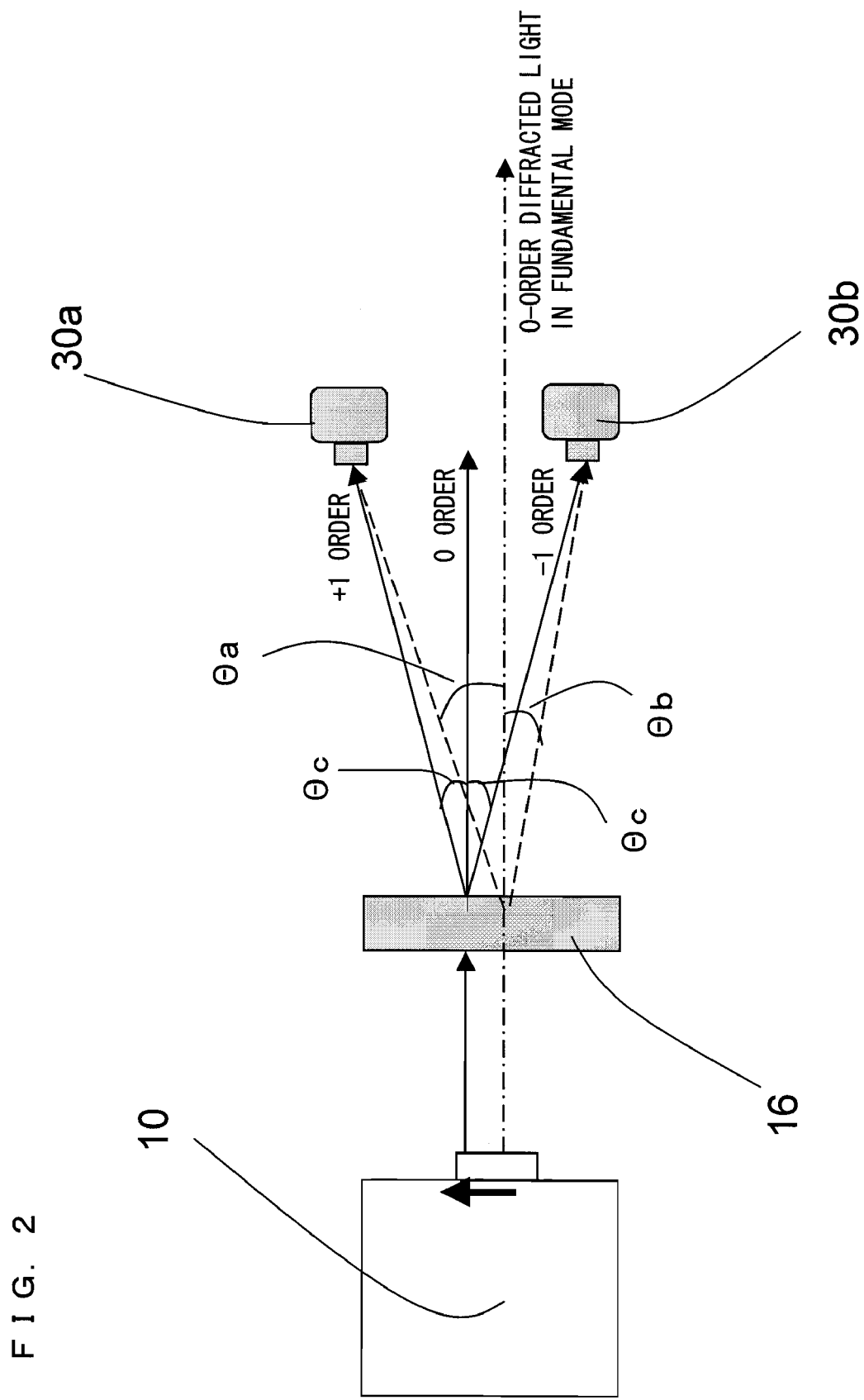
FIG. 2 is a diagram showing a state of the wavelength detector 11 in the case where a transverse mode changes.

Next, with reference to FIG. 2, the operation of the wavelength detector 11 in the case where the transverse mode changes from the state of FIG. 1 will be described. FIG. 2 is a diagram showing a state where the transverse mode changes in the wavelength detector 11. As shown in FIG. 2, when the transverse mode changes, the diffraction angles of the ±1-order diffracted lights do not change and only the intensity distribution of the ±1-order diffracted lights changes. FIG. 2 shows the intensity distribution of the ±1-order diffracted lights in the case where the diffraction angles of the ±1-order diffracted lights do not change and only the intensity distribution of the ±1-order diffracted lights changes. As shown in FIG. 2, the ±1-order diffracted lights shift by the same distance in the same direction on the photodetectors 30a and 30b, respectively. Thus, the angles θa and θb which are measured by the photodetectors 30a and 30b, respectively, have a relationship of (equation 2).

$$\theta a \neq \theta b \quad \text{(equation 2)}$$

Here, the average value of the angle θa measured by the photodetector 30a and the angle θb measured by the photodetector 30b is defined as an angle θc. That is, the angle θc is defined by (equation 3).

$$\theta c = (\theta a + \theta b)/2 \quad \text{(equation 3)}$$

When the longitudinal mode changes, the relationship of (equation 1) is satisfied, and thus θc=θa=θb. Therefore, the angle θc is the same as each of the diffraction angles of the ±1-order diffracted lights. Further, also when the transverse mode changes, the angle θc is the same as each of the diffraction angles of the ±1-order diffracted lights due to the symmetry of diffracted lights. That is, based on the angle θc defined by (equation 3), the wavelength detector 11 can obtain the diffraction angles of the ±1-order diffracted lights, regardless of the change of the transverse mode. Furthermore, since the diffraction angles of the ±1-order diffracted lights correspond to the wavelength of the laser light, the wavelength detector 11 can distinguish between the changes of the transverse mode and of the longitudinal mode of the laser light, and thus can detect the change of the wavelength of the laser light, by using the angle θc defined by (equation 3), as each of the diffraction angles.

Note that since the diffraction angle of a diffracted light having a high order on an absolute-value basis is great, the wavelength detector 11 may measure high-order diffracted lights to increase the resolution of wavelength detection. However, the higher the order the diffracted light, the smaller the light intensity. Therefore, when a diffracted light having a great light intensity is required, it is preferable to measure the ±1-order diffracted lights. Further, both photodetectors for measuring the ±1-order diffracted lights and photodetectors for measuring higher-order diffracted lights may be prepared such that the wavelength detector 11 uses the photodetectors for measuring the ±1-order diffracted lights when laser power is low, and also uses the photodetectors for measuring higher-order diffracted lights when the laser power is high. In this case, the wavelength detector 11 is required to include four or more photodetectors.

SECOND EMBODIMENT

Figure 3:
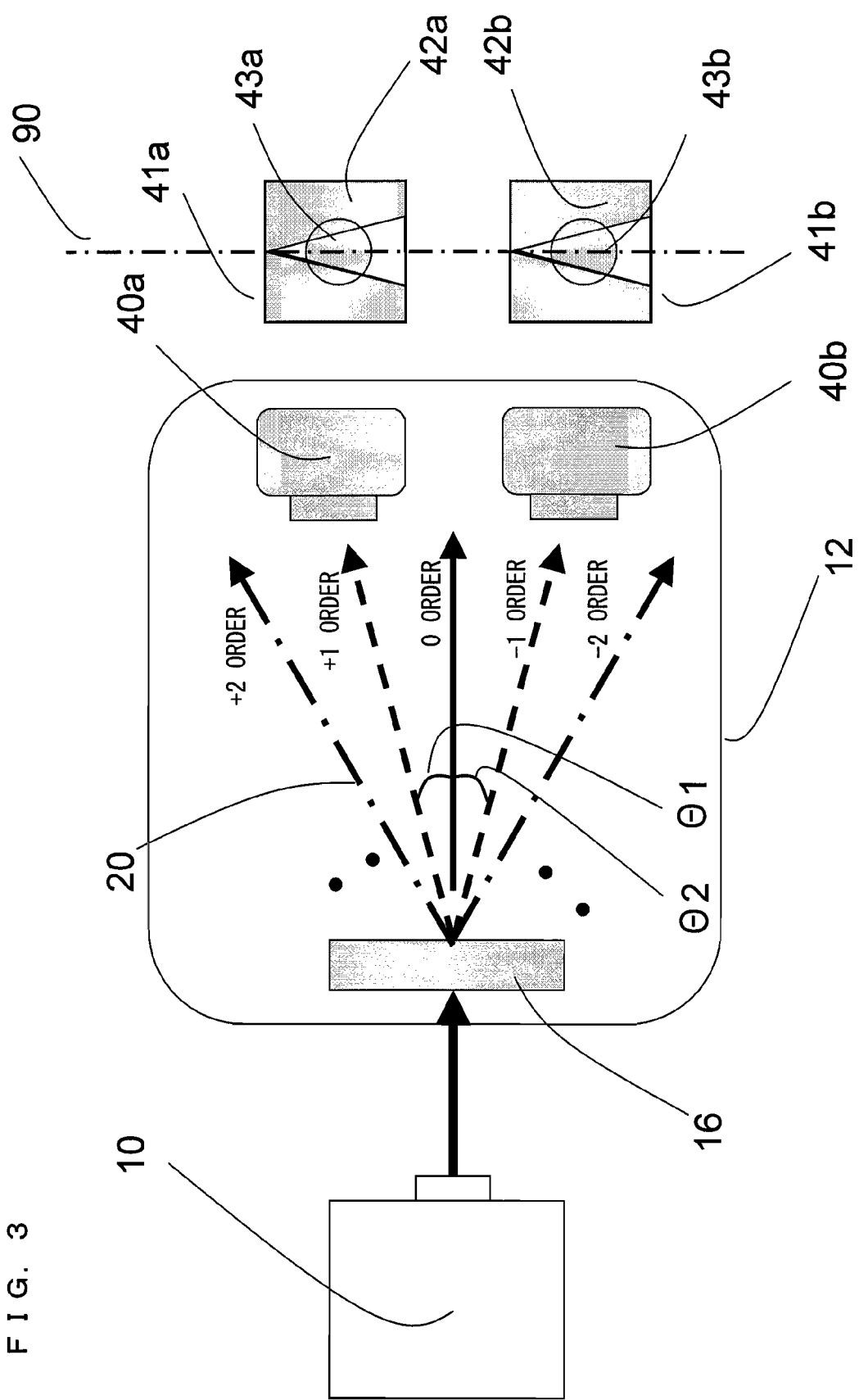
FIG. 3 is a schematic diagram showing an example structure of a wavelength detector 12 according to a second embodiment of the present invention.

FIG. 3 is a schematic diagram showing an example structure of a wavelength detector 12 according to a second embodiment of the present invention. Referring to FIG. 3, the wavelength detector 12 includes a diffraction grating 16 for diffracting a laser light emerging from a laser light source 10, and also includes at least two photodetectors 40a and 40b which measure a +n-order diffracted light and a −n-order diffracted light, respectively. The laser light emerging from the laser light source 10 is incident on the wavelength detector 12 provided in the light path of the laser light. In the wavelength detector 12, the laser light incident thereon is diffracted by the diffraction grating 16, and the diffracted laser lights interfere with one another and thus generate ±n-order diffracted lights 20. In this example, the photodetectors 40a and 40b measure a +1-order diffracted light and a −1-order diffracted light, respectively.

As shown in FIG. 3, on light incidence surfaces 41a and 41b of the photodetectors 40a and 40b, masks 42a and 42b for blocking lights are provided, respectively. That is, the light incidence surfaces 41a and 41b of the photodetectors 40a and 40b are divided into light incidence areas and light blocking areas by the masks 42a and 42b, respectively. Here, the light incidence areas each have a shape symmetrical with respect to an axis 90 and including certain slopes to the axis 90. In the example of FIG. 3, the light incidence areas are each an isosceles triangle symmetrical with respect to the axis 90. The axis 90 is a straight line which is orthogonal to a 0-order diffracted light and which passes through the light incidence surfaces. That is, when the wavelength of the laser light changes, the axis 90 overlaps the trajectories of the beam spot 43a of the +1-order diffracted light moving on the light incidence surface 41a and the beam spot 43b of the −1-order diffracted light moving on the light incidence surface 41b.

Since the light incidence areas each has a symmetrical shape with respect to the axis 90 and each includes a certain slope to the axis 90, when the positions of the beam spots 43a and 43b change, both the area of the +1-order diffracted light incident on the light incidence area of the light incidence surface 41a and the area of the −1-order diffracted light incident on the light incidence area of the light incidence surface 41b change, respectively. Thus, when the positions of the beam spots 43a and 43b change, the light intensities of the ±1-order diffracted lights incident on the light incidence areas change, respectively.

A method for distinguishing between the changes of the longitudinal mode and of the transverse mode, using the light intensities measured by the photodetectors 40a and 40b, will be described in detail below. As described above in the Description of the Background Art, when the longitudinal mode changes (i.e., when the wavelength of the laser light changes), diffraction angles change as shown in FIG. 22. Since the diffraction angles of diffracted lights having the same order on an absolute-value basis are equal to each other, the diffraction angles of the +1-order diffracted light and the −1-order diffracted light are equal to each other. That is, when the longitudinal mode changes, the beam spot 43a of the +1-order diffracted light incident on the light incidence surface 41a of the photodetector 40a and the beam spot 43b of the −1-order diffracted light incident on the light incidence surface 41b of the photodetector 40b move symmetrically with respect to the 0-order diffracted light.

That is, the photodetectors 40a and 40b detect the diffracted lights of the state of FIG. 3. The state of FIG. 3 is the fundamental mode in which, when the diffraction angle of the +1-order diffracted light is θ1 and the diffraction angle of the −1-order diffracted light is θ2, a relationship of (equation 4) holds true.

$$\theta 1 = \theta 2 \quad \text{(equation 4)}$$

In this case, the light intensity measured by the light incidence surface 41a of the photodetector 40a is a1 and the light intensity measured by the light incidence surface 41b of the photodetector 40b is a2. When the difference between the light intensity a1 measured by the light incidence surface 41a of the photodetector 40a and the light intensity a2 measured by the light incidence surface 41b of the photodetector 40b is defined as a light intensity α, the light intensity a is represented by (equation 5).

$$\alpha = a1 - a2 \quad \text{(equation 5)}$$

The photodetectors 40a and 40b are positioned symmetrically with respect to the 0-order diffracted light and are also positioned such that the +1-order diffracted light is positioned at the center of the light incidence surface 41a of the photodetector 40a and the −1-order diffracted light is positioned at the center of the light incidence surface 41b of the photodetector 40b. Note, however, that the masks 42a and 42b which are provided on the photodetectors 40a and 40b, respectively, are directed to the same direction.

In this case, the light intensity a1 measured by the photodetector 40a and the light intensity a2 measured by the photodetector 40b are equal to each other due to the symmetry of diffracted lights, and a relationship of (equation 6) holds true. In this case, when (equation 6) is assigned to (equation 5), the light intensity α=0.

$$a1 = a2 \quad \text{(equation 6)}$$

Figure 4:
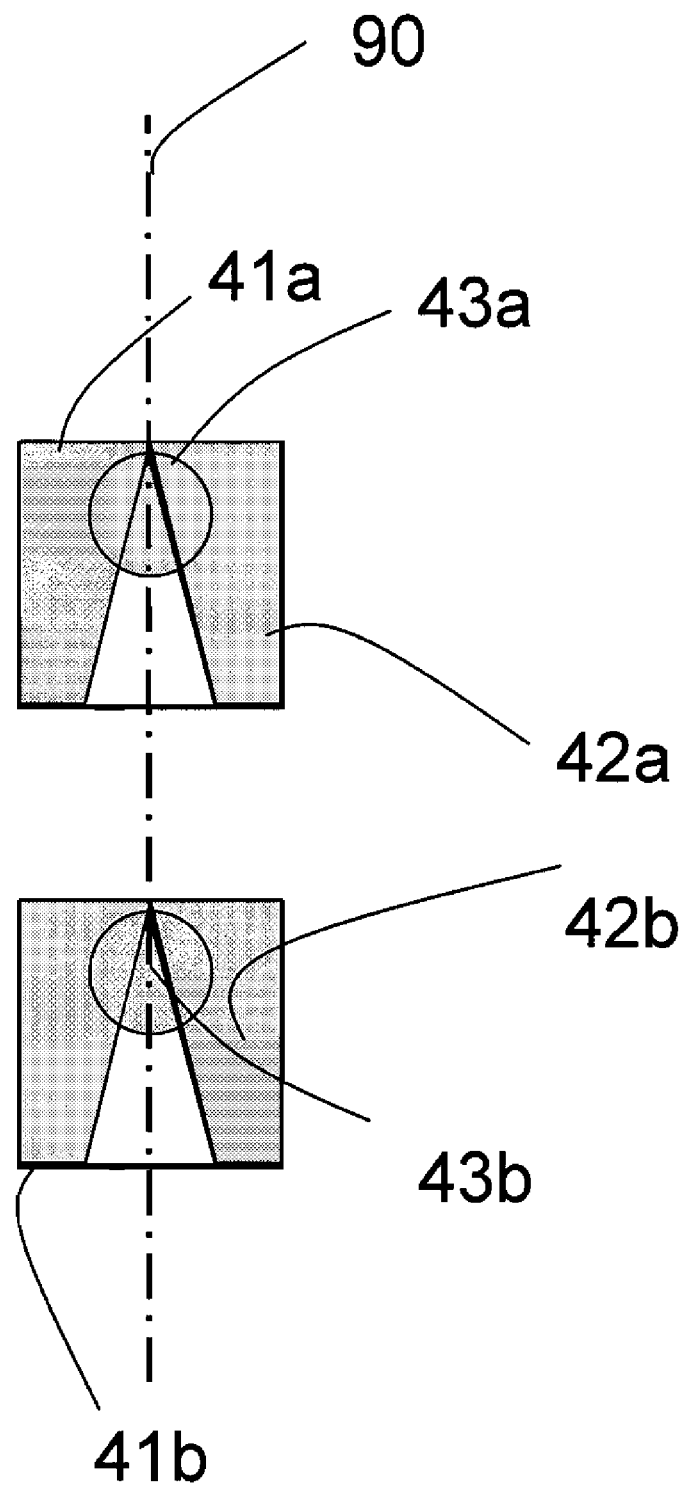
FIG. 4 is a diagram showing an example of light incidence surfaces of photodetectors 40a and 40b in the case where the transverse mode changes.

Next, with reference to FIG. 4, a state where the transverse mode changes from the above-described state will be described. It is assumed that when the intensity distribution of the laser lights changes, the beam spots 43a and 43b on the light incidence surfaces 41a and 41b of the photodetectors 40a and 40b, respectively, have, for example, the intensity distribution as shown in FIG. 4. FIG. 4 is a diagram showing an example of the light incidence surfaces 41a and 41b of the photodetectors 40a and 40b, respectively, in the case where the transverse mode changes. When the transverse mode changes, the diffraction angles of the ±1-order diffracted lights do not change and only the intensity distribution of the ±1-order diffracted lights changes. As shown in FIG. 4, it is indicated that the positions of the beam spots 43a and 43b of the ±1-order diffracted lights shift by the same distance in the same direction on the photodetectors 40a and 40b, respectively. Thus, the light intensity a1 measured by the photodetector 40a and the light intensity a2 measured by the photodetector 40b satisfy the relation ship of (equation 6) even when the transverse mode changes, and therefore the light intensity α=0 does not change.

Figure 5:
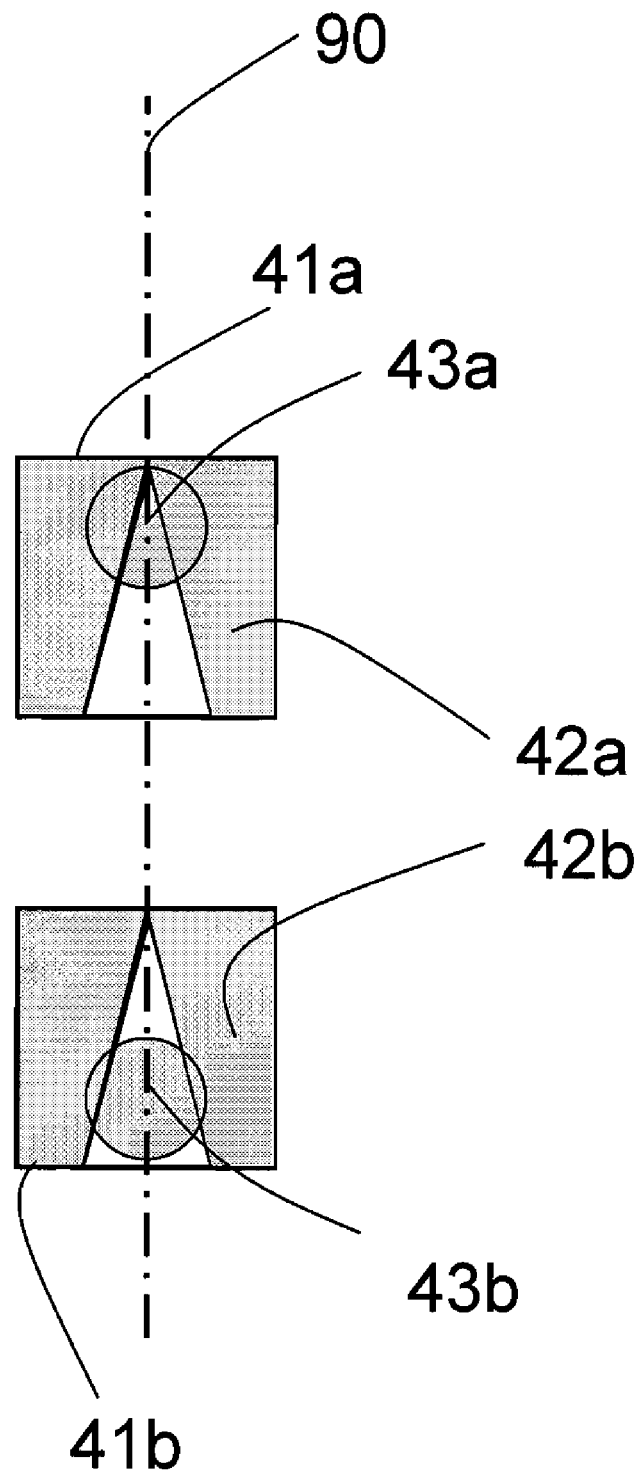
FIG. 5 is a diagram showing an example of the light incidence surfaces of the photodetectors 40a and 40b in the case where a longitudinal mode changes.

Next, with reference to FIG. 5, a state where the longitudinal mode changes (i.e., when the wavelength of the laser light changes) from the state of FIG. 3 will be described. Since diffraction angles change when the wavelength changes, the diffraction angle θ1 of the +1-order diffracted light changes to θ1+Δθ. The diffraction angle θ2 of the −1-order diffracted light changes to θ2+Δθ due to the symmetry of diffracted lights. FIG. 5 is a diagram showing an example of the light incidence surfaces 41a and 41b of the photodetectors 40a and 40b, respectively, in the case where the longitudinal mode changes. When the wavelength changes, the positions of the beam spots 43a and 43b on the light incidence surfaces 41a and 41b, respectively, are positioned as shown in FIG. 5.

Here, when Δθ is a positive value, the wavelength is long. On the other hand, when Δθ is a negative value, the wavelength is short. Since the +1-order diffracted light and the −1-order diffracted light change the positions thereof symmetrically with respect to the 0-order diffracted light, the area of the +1-order diffracted light incident on the light incidence area of the light incidence surface 41a and the area of the −1-order diffracted light incident on the light incidence area of the light incidence surface 41b differ from each other. Thus, the light intensity a1 measured by the photodetector 40a and the light intensity a2 measured by the photodetector 40b have a relationship of (equation 7). When Δθ is a positive value, the light intensity α is a positive value based on (equation 5). On the other hand, when Δθ is a negative value, the light intensity α is a negative value based on (equation 5).

$$a1 \neq a2 \quad \text{(equation 7)}$$

These results show that the value of the light intensity α, which is the difference between the light intensity a1 and the light intensity a2, changes, not depending on the change of the transverse mode, but rather depending only on the change of the longitudinal mode. That is, the wavelength detector 12 can distinguish between the changes of the transverse mode and of the longitudinal mode of the laser light, and thus can detect the change of the wavelength of the laser light with high accuracy, by using the light intensity α, which is the difference between the light intensity a1 and the light intensity a2. The wavelength detector 12 can be realized with a simple structure only by providing the masks 42a and 42b on the light incidence surfaces of the two general photodetectors 40a and 40b, respectively.

Figure 6:
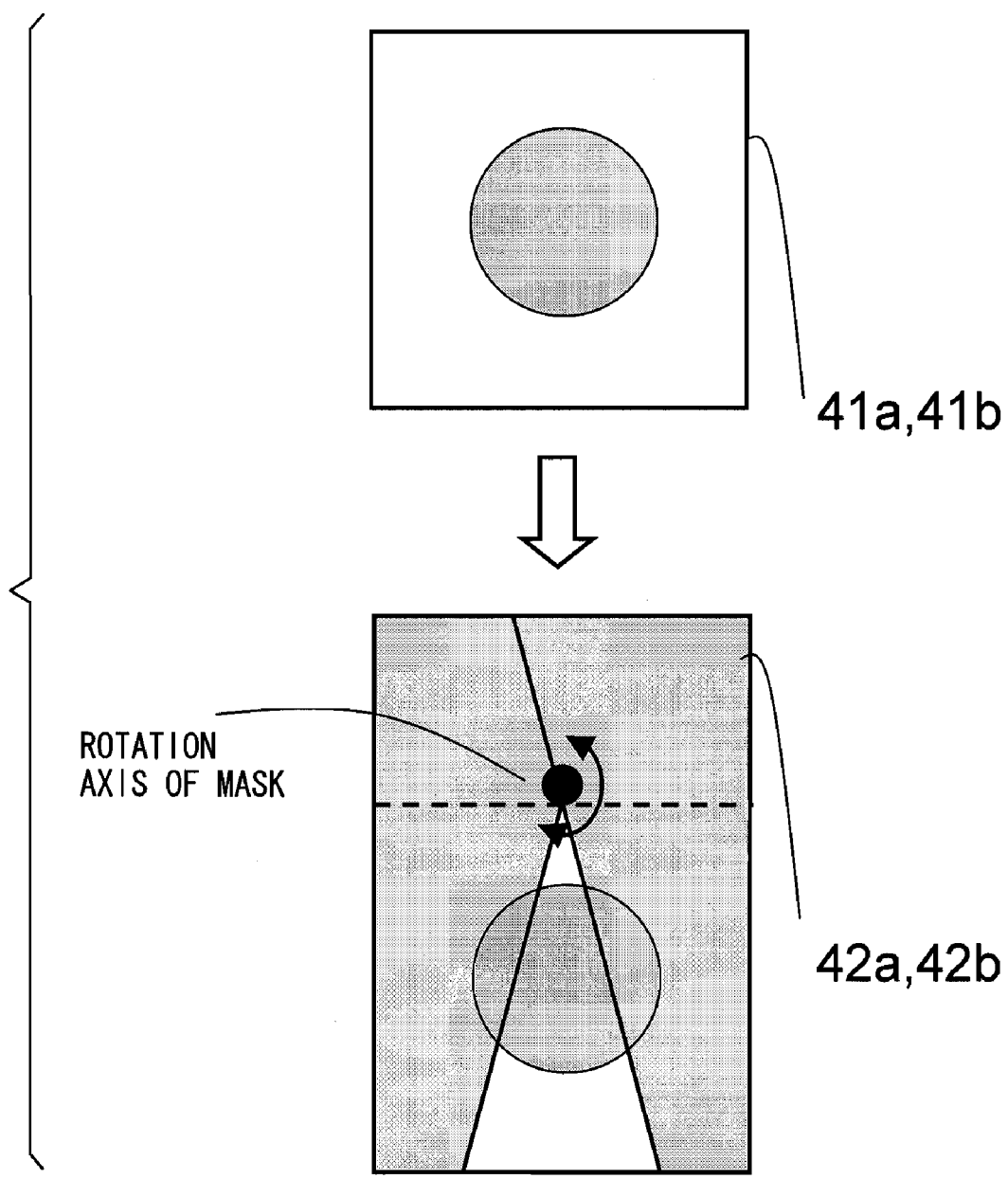
FIG. 6 is a diagram showing an example of a mask 42a or 42b capable of changing the area of a corresponding light incidence area.

Note that the masks 42a and 42b may be capable of changing the areas of the light incidence areas in accordance with the beam shapes of the diffracted lights. That is, when the beam diameters of the diffracted lights are increased, the masks 42a and 42b can accordingly increase the areas of the light incidence areas, and when the beam diameters of the diffracted lights are reduced, the masks 42a and 42b can accordingly reduce the areas of the light incidence areas. FIG. 6 is a diagram showing an example of the mask 42a or 42b capable of changing the area of the corresponding light incidence area. In the example of FIG. 6, the masks 42a and 42b are each movable symmetrically with respect to the axis 90 so as to increase or reduce the area of the corresponding light incidence area. Consequently, the wavelength detector 12 can accurately capture the diffracted lights in the light incidence areas, and thus can detect the change of the wavelength (the longitudinal mode) with high accuracy, even when the beam diameters of the diffracted lights change.

Further, the wavelength detector 12 may include, in front of the photodetectors 40a and 40b, lenses for increasing the beam diameters of the ±1-order diffracted lights, respectively. Note, however, that the lens for increasing the beam diameter of the +1-order diffracted light and the lens for increasing the beam diameter of the −1-order diffracted light have the same characteristics. Consequently, the wavelength detector 12 can accurately capture the ±1-order diffracted lights in the light incidence areas, and thus can detect the change of the wavelength of the laser light with high accuracy, even when the beam diameters of the ±1-order diffracted lights change. Furthermore, even when dust is attached to the light incidence surfaces 41a and 41b of the photodetectors 40a and 40b, respectively, the wavelength detector 12 can reduce the effect of the dust by increasing the beam diameters of the ±1-order diffracted lights and thus increasing the beam diameters of the ±1-order diffracted lights incident on the light incidence surfaces 41a and 41b, respectively.

THIRD EMBODIMENT

Figure 7:
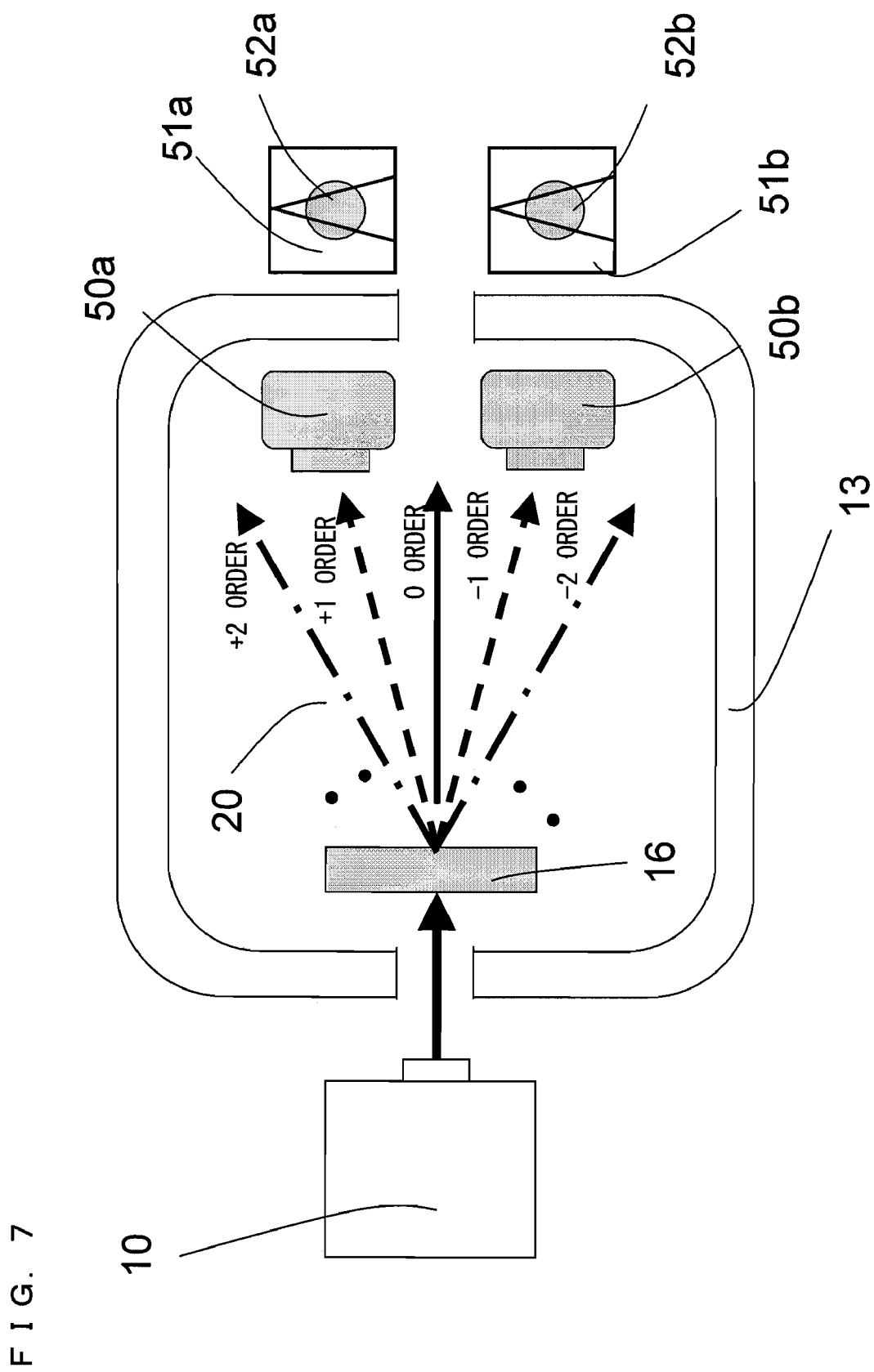
FIG. 7 is a schematic diagram showing an example structure of a wavelength detector 13 according to a third embodiment of the present invention.

FIG. 7 is a schematic diagram showing an example structure of a wavelength detector 13 according to a third embodiment of the present invention. Referring to FIG. 7, the wavelength detector 13 includes a diffraction grating 16 for diffracting a laser light emerging from a laser light source 10, and also includes at least two photodetectors 50a and 50b which measure a +n-order diffracted light and a −n-order diffracted light, respectively. The laser light emerging from the laser light source 10 is incident on the wavelength detector 13 provided in the light path of the laser light. In the wavelength detector 13, the laser light incident thereon is diffracted by the diffraction grating 16, and the diffracted laser lights interfere with one another and thus generate ±n-order diffracted lights 20. In this example, the photodetectors 50a and 50b measure a +1-order diffracted light and a −1-order diffracted light, respectively.

Figure 9:
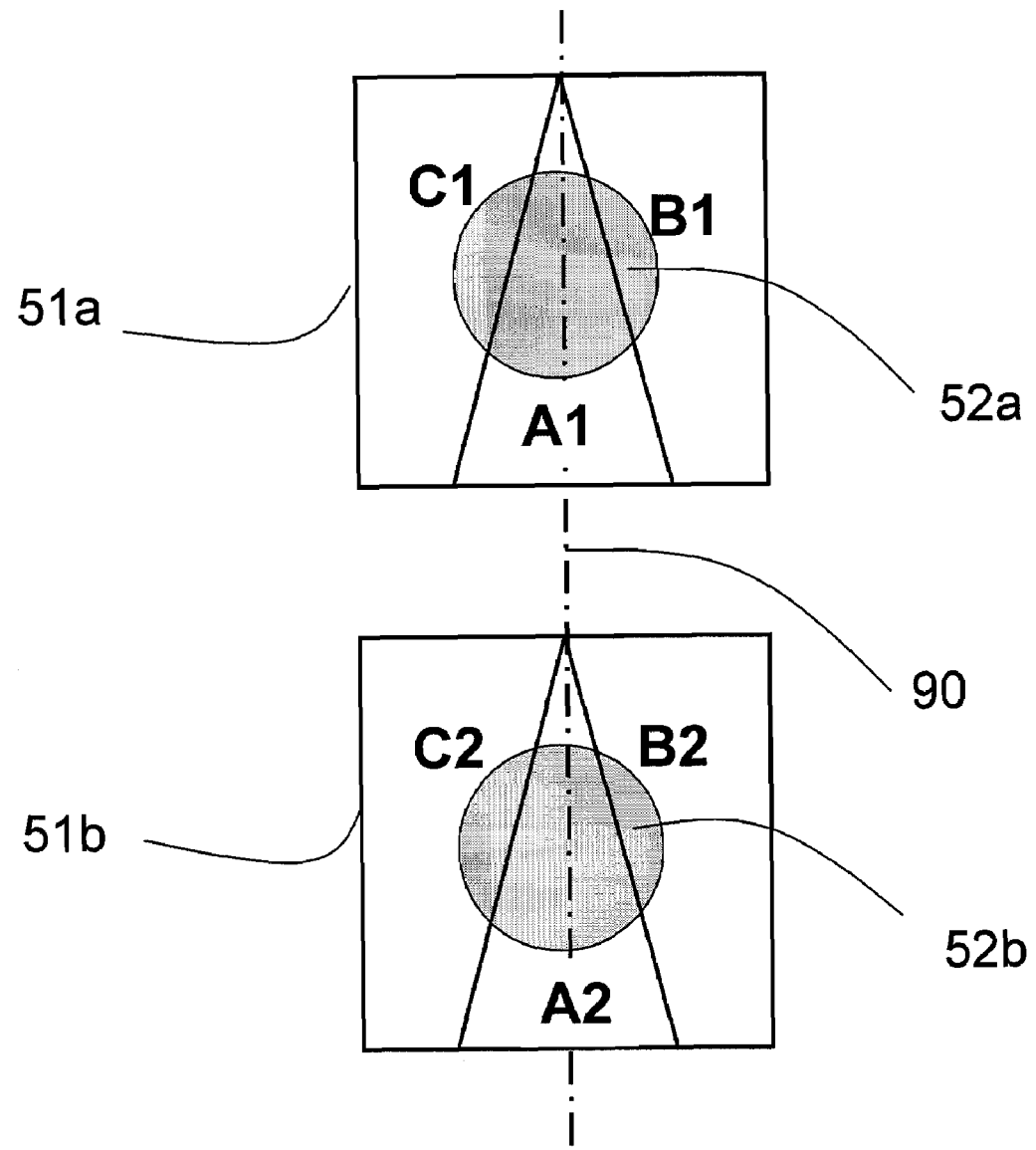
FIG. 9 is a diagram showing light incidence surfaces 51a and 51b of the photodetectors in the case where a laser light is in a fundamental mode.
Figure 10:
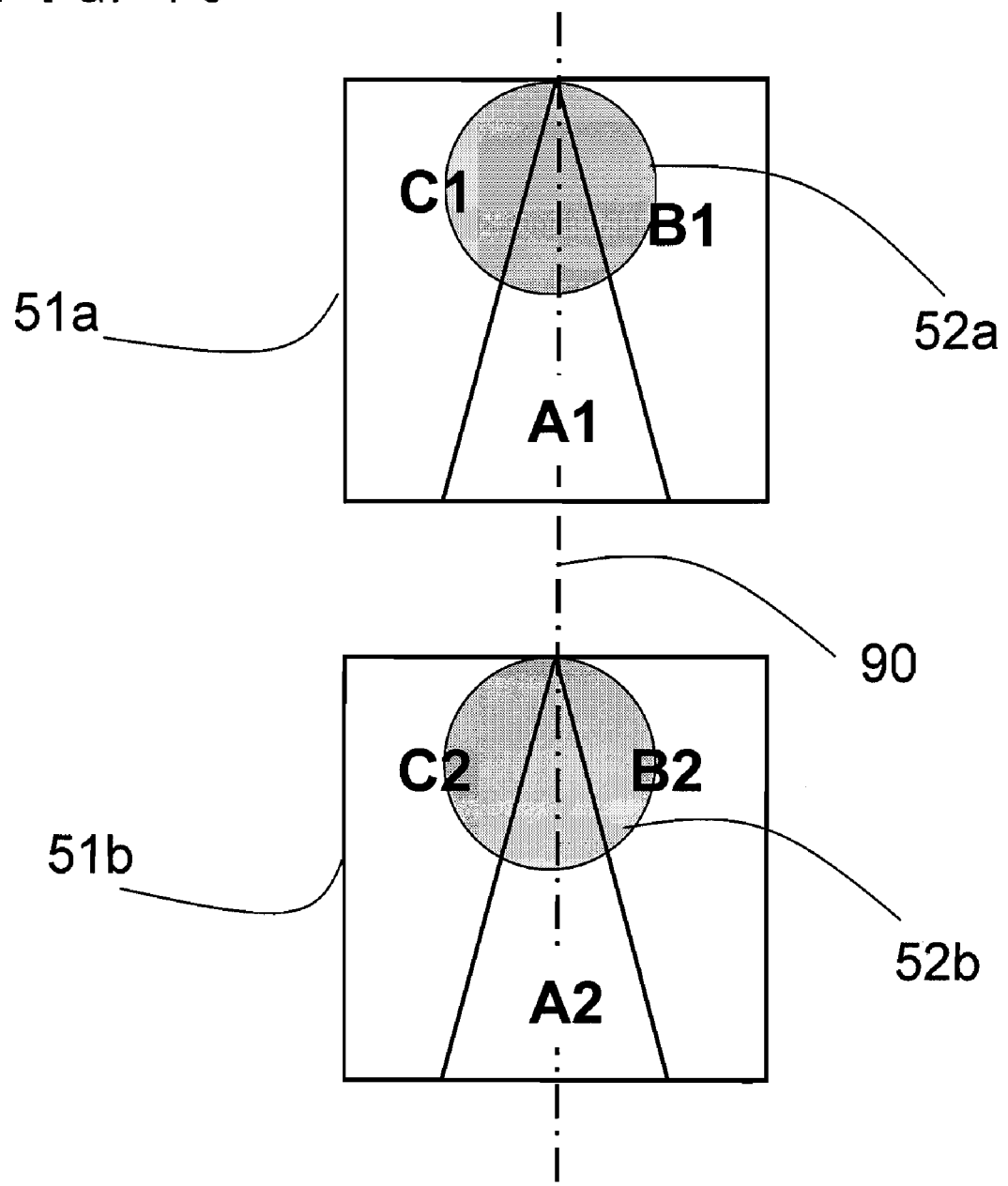
FIG. 10 is a diagram showing the light incidence surfaces 51a and 51b of the photodetectors in the case where the transverse mode changes.

Referring to FIG. 7, a beam spot 52a is the beam spot of the +1-order diffracted light incident on a light incidence surface 51a and a beam spot 52b is the beam spot of the −1-order diffracted light incident on a light incidence surface 51b. The light incidence surfaces 51a and 51b of the photodetectors 50a and 50b, respectively, are each divided into a plurality of areas as shown in FIG. 8. For example, as shown in FIGS. 9 through 11, the light incidence surface 51a of the photodetector 50a is divided into areas A1, B1, and C1. On the other hand, the light incidence surface 51b of the photodetector 50b is divided into areas A2, B2, and C2. Note, however, that the light incidence surface 51a and the light incidence surface 51b are divided into the same shapes as each other. That is, the area A1 and the area A2 have the same shape, the area B1 and the area B2 have the same shape, and the area C1 and the area C2 have the same shape.

Since the light incidence surfaces 51a and 51b are each divided into the plurality of areas, the photodetectors 50a and 50b can calculate the light intensities separately measured in all of the divided areas. In this case, a light intensity α1 is defined by (equation 8), using the light intensities separately measured in all of the divided areas. Note, however, that in (equation 8), the light intensities measured in the divided areas A1, B1, and C1 are A1, B1, and C1, respectively, and the light intensities measured in the divided areas A2, B2, and C2 are A2, B2, and C2, respectively, for ease of description.

$$\alpha 1 = -(A1-A2)+(B1-B2)+(C1-C2)/(A1+A2+B1+B2+C1+C2) \quad \text{(equation 8)}$$

FIG. 9 shows the positions of the beam spots 52a and 52b in the case where the transverse mode is in the fundamental mode. When the transverse mode changes from this state (i.e., from the state where the transverse mode is in the fundamental mode), the positions of the beam spots 52a and 52b change to, for example, the positions shown in FIG. 10. On the other hand, when the longitudinal mode changes, the positions of the beam spots 52a and 52b change to, for example, the positions shown in FIG. 11. For a similar reason to the second embodiment and based on (equation 8), α1=0 when the transverse mode changes, and α1≠0 when the longitudinal mode changes (i.e., when the wavelength of the laser light changes). Further, α1>0 when the wavelength is long, and α1<0 when the wavelength is short.

Further, the light intensity α1 defined by (equation 8) is a constant value, regardless of the change of the transverse mode (i.e., the change of the laser power). The reason will be described below. In the case of the structure of FIG. 7, even when the wavelength of the laser light does not change, there may be the case where α1≠0, due to slight displacement of the photodetectors 50a and 50b or to the effect of dust and the like attached to the light incidence surfaces 51a and 51b. In (equation 8), the numerator of the right-hand side is the difference between the sum of the light intensities measured by all of the divided areas of the photodetector 50a and the sum of the light intensities measured by all of the divided areas of the photodetector 50b. Further, in (equation 8), the denominator of the right-hand side is the sum of the light intensities measured by all of the divided areas of the two photodetectors 50a and 50b. Consequently, when the laser power is increased, both the numerator and the denominator of the right-hand side of (equation 8) are accordingly increased at the same rate.

Therefore, the value of the light intensity α1 is not affected by the change of the laser power. That is, the wavelength detector 13 can distinguish between the changes of the transverse mode and of the longitudinal mode of the laser light, and thus can detect the change of the wavelength of the laser light with high accuracy, by using the value of the light intensity α1.

Further, (equation 8) includes the light intensities of the whole laser-irradiated surfaces. That is, the wavelength detector 13 according to the third embodiment always uses a high-intensity portion of the laser light to detect the wavelength, and thus can detect the change of the wavelength of the laser light with high accuracy.

Figure 12:
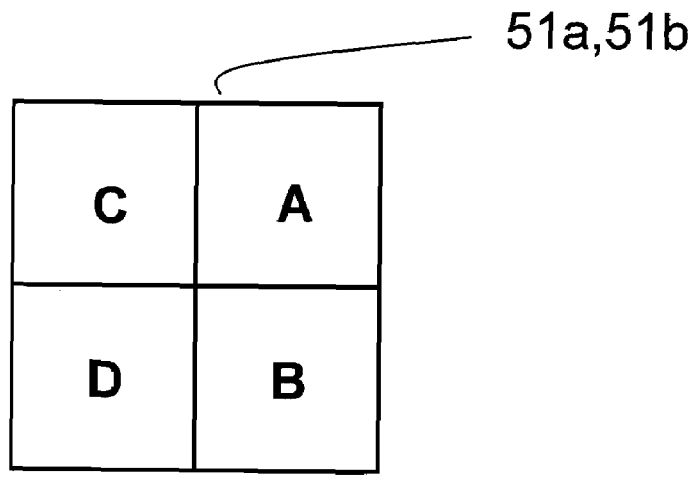
FIG. 12 is a diagram showing a photodetector having the light incidence surface 51a or 51b vertically and horizontally divided into four areas.
Figure 13:
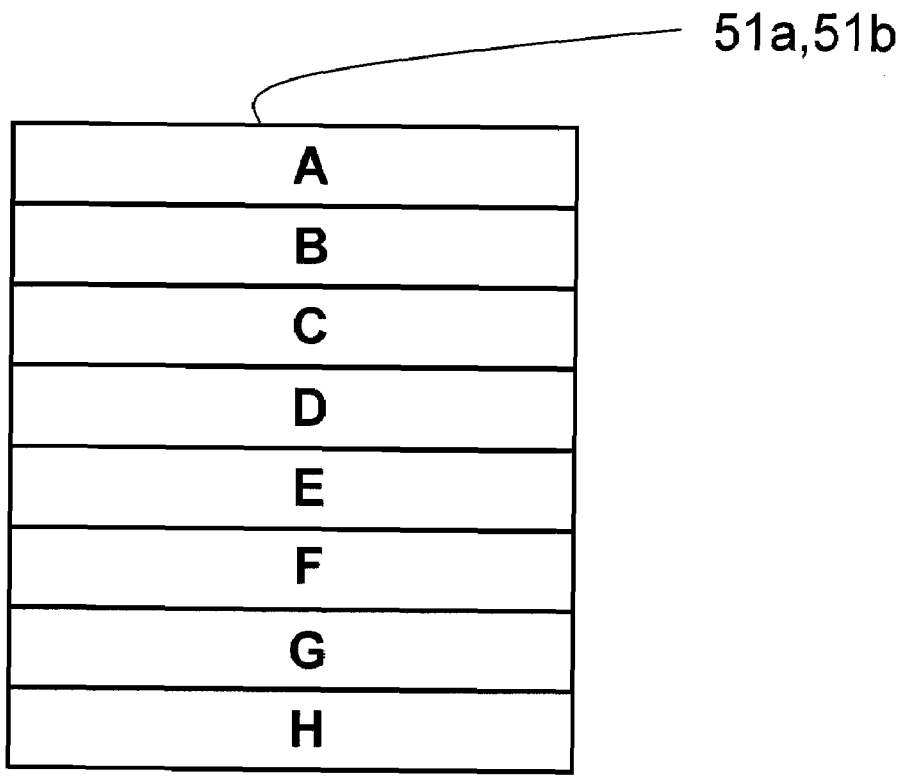
FIG. 13 is a diagram showing a photodetector having the light incidence surface 51a or 51b divided into rectangles.

Further, the wavelength detector 13 according to the third embodiment may use, as the photodetectors 50a and 50b, photodetectors having the light incidence surfaces 51a and 51b, respectively, each of which are vertically and horizontally divided into four areas in an array as shown in FIG. 12. Furthermore, the wavelength detector 13 may use, as the photodetectors 50a and 50b, photodetectors having the light incidence surfaces 51a and 51b, respectively, each of which are divided into rectangles as shown in FIG. 13. The above-described photodetectors 50a and 50b may be used, whereby it is possible to increase the measurement range of the laser light.

Further, it is preferable that in the wavelength detector 13 according to the third embodiment, the light incidence surfaces 51a and 51b of the photodetectors 50a and 50b, respectively, are each divided into a shape symmetrical with respect to the axis 90 and including certain slopes to the axis 90 as shown in FIGS. 9 and 10. The above-described photodetectors 50a and 50b may be used, whereby it is possible to increase the area of the laser light crossing the divided areas and thus is possible to increase the measurement range of the laser light.

Further, since in the wavelength detector 13 according to the third embodiment, the laser light is received by all of the divided light incidence areas, it is possible to calculate the sum of the laser power. Thus, the wavelength detector 13 can concurrently measure the wavelength of the laser light and the laser power.

Figure 14:
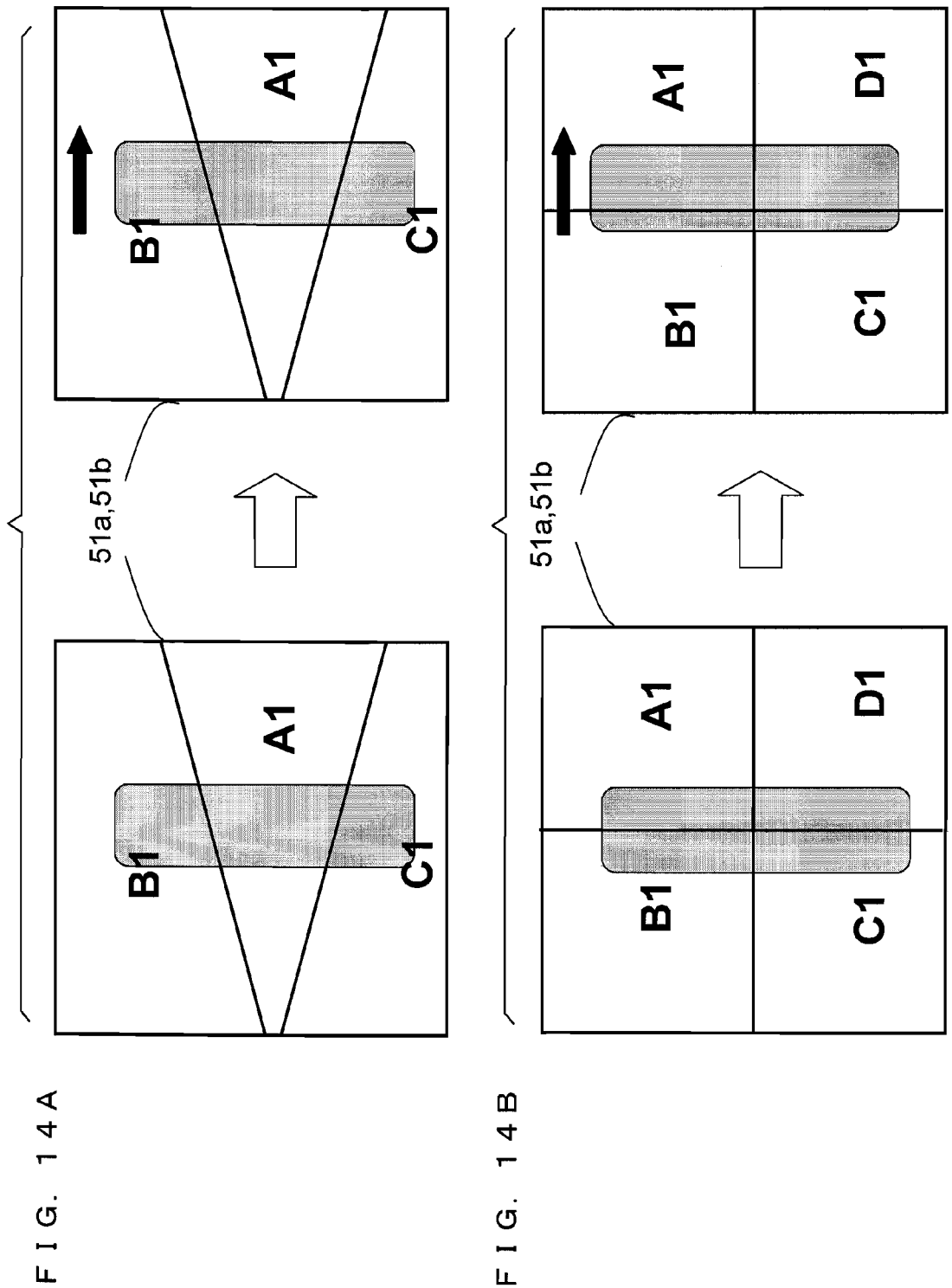
FIG. 14A is a diagram showing an example of the divided light incidence surface 51a or 51b.
FIG. 14B is a diagram showing an example of the divided light incidence surface 51a or 51b.

Further, it is preferable that in the wavelength detector 13 according to the third embodiment, the beam shape of the laser light to be measured is rectangular as shown in FIGS. 14A and 14B. The reason is that in an image display device using a laser light as a light source, the laser light is likely to be formed into a rectangle. Referring to FIG. 14A, it is indicated that when the longitudinal axis of the rectangle is sufficiently long for each of the divided areas, the amount of change of the light intensity α1 which corresponds to the change of the wavelength is affected by the slopes of the divided areas, and therefore does not depend on the beam shape. Furthermore, referring to FIG. 14B, it is indicated that when a photodetector vertically and horizontally divided into four parts in an array is used, the amount of change of the light intensity α1 is affected by the length of the longitudinal axis of the rectangle, and therefore changes depending on the state of the laser light.

FOURTH EMBODIMENT

Figure 15:
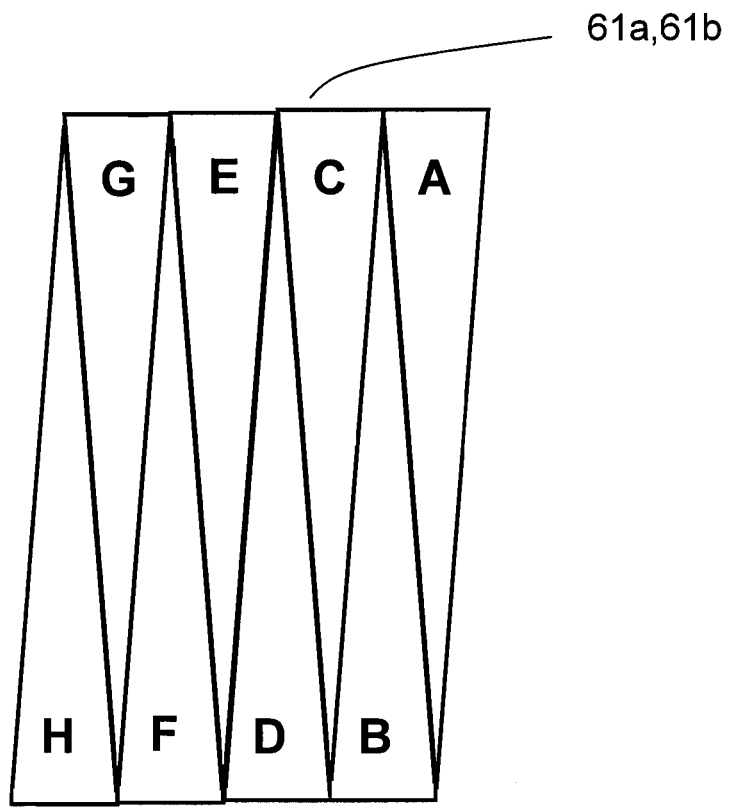
FIG. 15 is a diagram showing an example of divided shapes of a light incidence surface 61a or 61b of a photodetector according to a fourth embodiment of the present invention.

A wavelength detector 14 according to a fourth embodiment of the present invention is different from the wavelength detector 13 according to the third embodiment in divided shapes of light incidence surfaces of photodetectors. Since the other elements are the same as those of the third embodiment, FIG. 3 is used as a schematic diagram showing a structure of the wavelength detector 14. FIG. 15 is a diagram showing an example of divided shapes of a light incidence surface 61a or 61b of photodetectors according to the fourth embodiment of the present invention. As shown in FIG. 15, the wavelength detector 14 according to the fourth embodiment increases the measurement range of the change of the transverse mode by dividing the light incidence surfaces 61a and 61b of the photodetectors into multiple areas.

Figure 16:
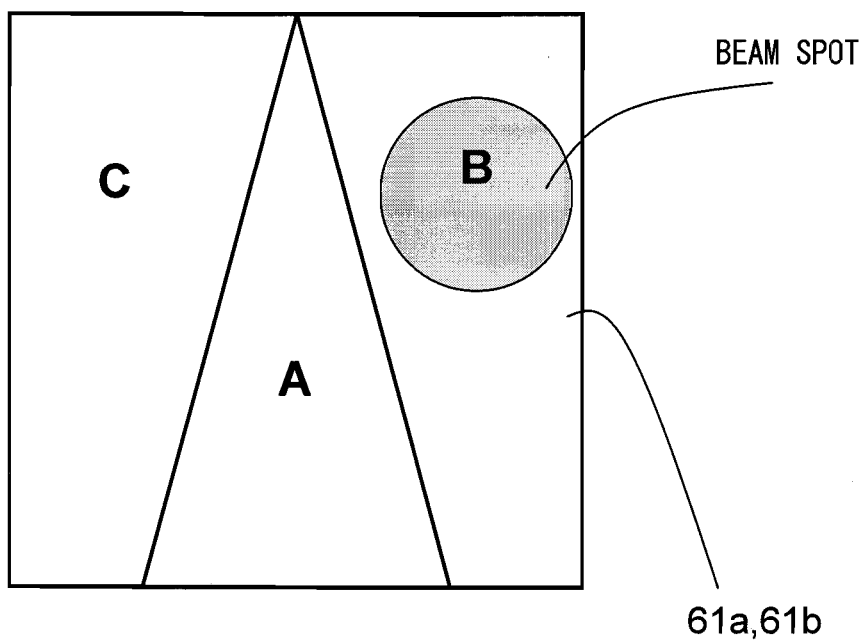
FIG. 16 is a diagram showing a state where a beam spot is cast onto a specific divided area of the light incidence surface 61a or 61b.

With reference to FIG. 16, the reason will be described. FIG. 16 is a diagram showing a state where a beam spot is cast onto only a specific divided area of the light incidence surface 61a or 61b. For example, in the case where the light incidence surface 61a and 61b of the photodetectors each have three divided areas as shown in FIG. 16, when the beam spot of the laser light is too small to cross the divided areas, some of the divided area cannot measure the wavelength of the laser light. On the other hand, in the case where the light incidence surfaces 61a and 61b of the photodetectors are each divided into multiple areas as shown in FIG. 15, the divided areas are so dense for the change of the transverse mode as to increase the measurement range of the laser light. Further, since the area of each of the divided areas is small, it is possible to improve the measurement accuracy. Furthermore, since the area of each of the divided areas is small, it is possible to measure the laser light even when the beam diameter of the laser light is small.

FIFTH EMBODIMENT

Figure 17:
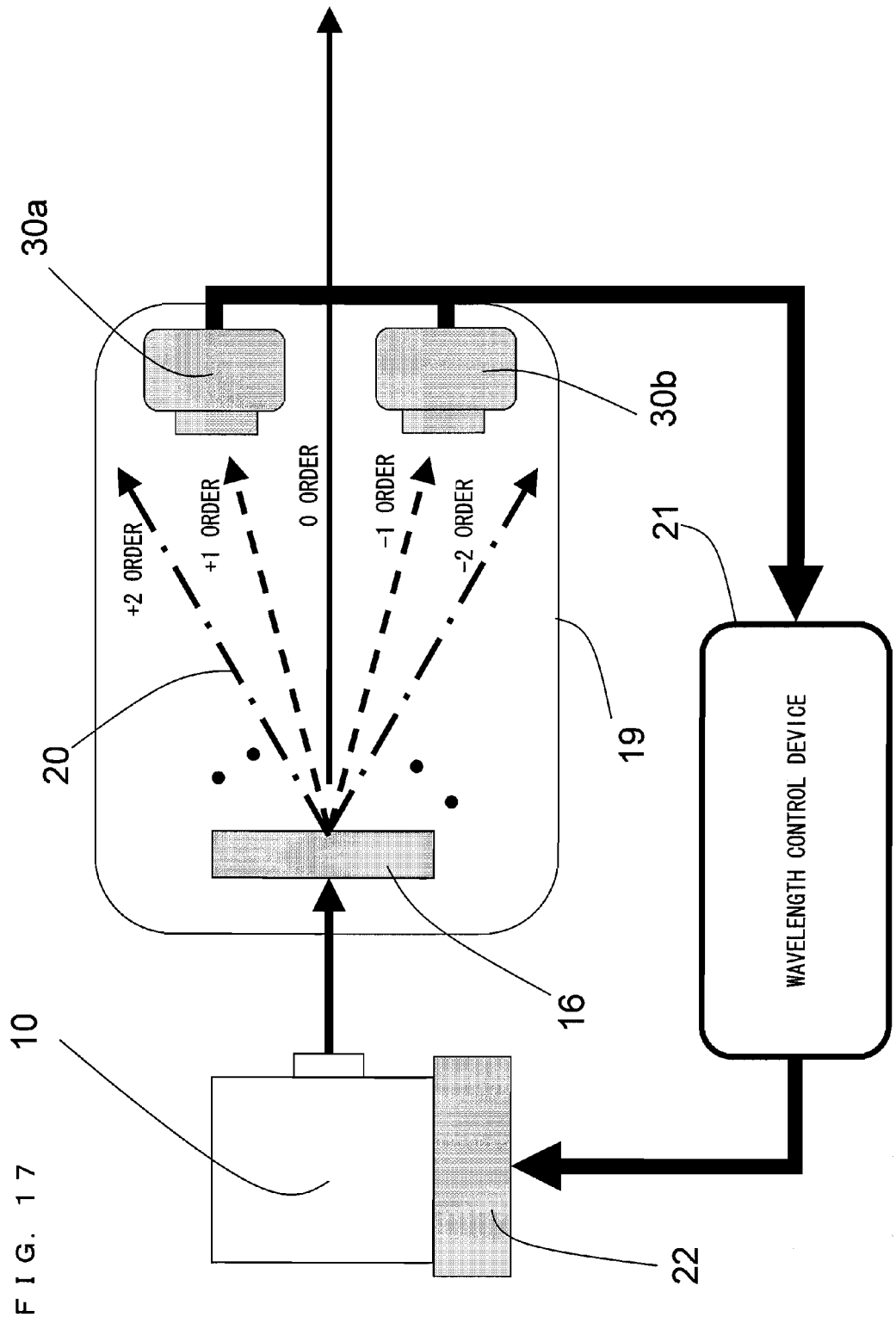
FIG. 17 is a schematic diagram showing an example structure of a wavelength stabilization laser device according to a fifth embodiment of the present invention.

FIG. 17 is a schematic diagram showing an example structure of a wavelength stabilization laser device according to a fifth embodiment of the present invention. Referring to FIG. 17, the wavelength stabilization laser device includes a laser light source 10, a wavelength detector 19, and a wavelength control device 21. Any one of the wavelength detectors 11 through 14 according to the first through fourth embodiments, respectively, is used as the wavelength detector 19. The wavelength control device 21 controls the laser light source 10 based on the change of the wavelength detected by the wavelength detector 19, such that the wavelength of the laser light is constant. Taking as an example the case where the wavelength detector 13 according to the third embodiment is used as the wavelength detector 19, the specific operation of the wavelength stabilization laser device will be described below.

The wavelength detector 19 is positioned such that the light intensity α1=0 when the laser light has a desired wavelength. The wavelength control device 21 observes the light intensity α1 detected by the wavelength detector 19 and controls the temperature of the laser light source 10 by controlling a Peltier device 22 attached to the laser light source 10 when the value of the light intensity α1 changes due to a time factor and an external factor. Since the laser light source 10 changes the wavelength by temperature, the wavelength control device 21 can keep the wavelength of the laser light source 10 constant by controlling the temperature of the laser light source 10. That is, the wavelength stabilization laser device can distinguish between the changes of the transverse mode and of the longitudinal mode of the laser light by using the wavelength control device 21 to control the temperature of the laser light source 10 to bring the light intensity α1 close to 0, and thus can realize the laser light source 10 having a constant wavelength.

Note that in the case where a general wavelength stabilization laser device uses the laser light source 10 having high power, it is essential to regulate the temperature of the laser light source 10 due to its great heat value. Therefore, the general wavelength stabilization laser device is likely to include a structure for controlling the temperature of a laser light source. Thus, it is possible to realize the wavelength stabilization laser device of the present invention by using the structure for controlling the temperature of a laser light source, which is included in the general wavelength stabilization laser device, without separately preparing a special circuit or the like.

Further, the wavelength stabilization laser device of the present invention may control the wavelength of the laser light by mechanically displacing the resonator length of the laser light source 10 in accordance with the output from the wavelength detector 19, as well as controlling the temperature of the laser light source 10.

SIXTH EMBODIMENT

Figure 18:
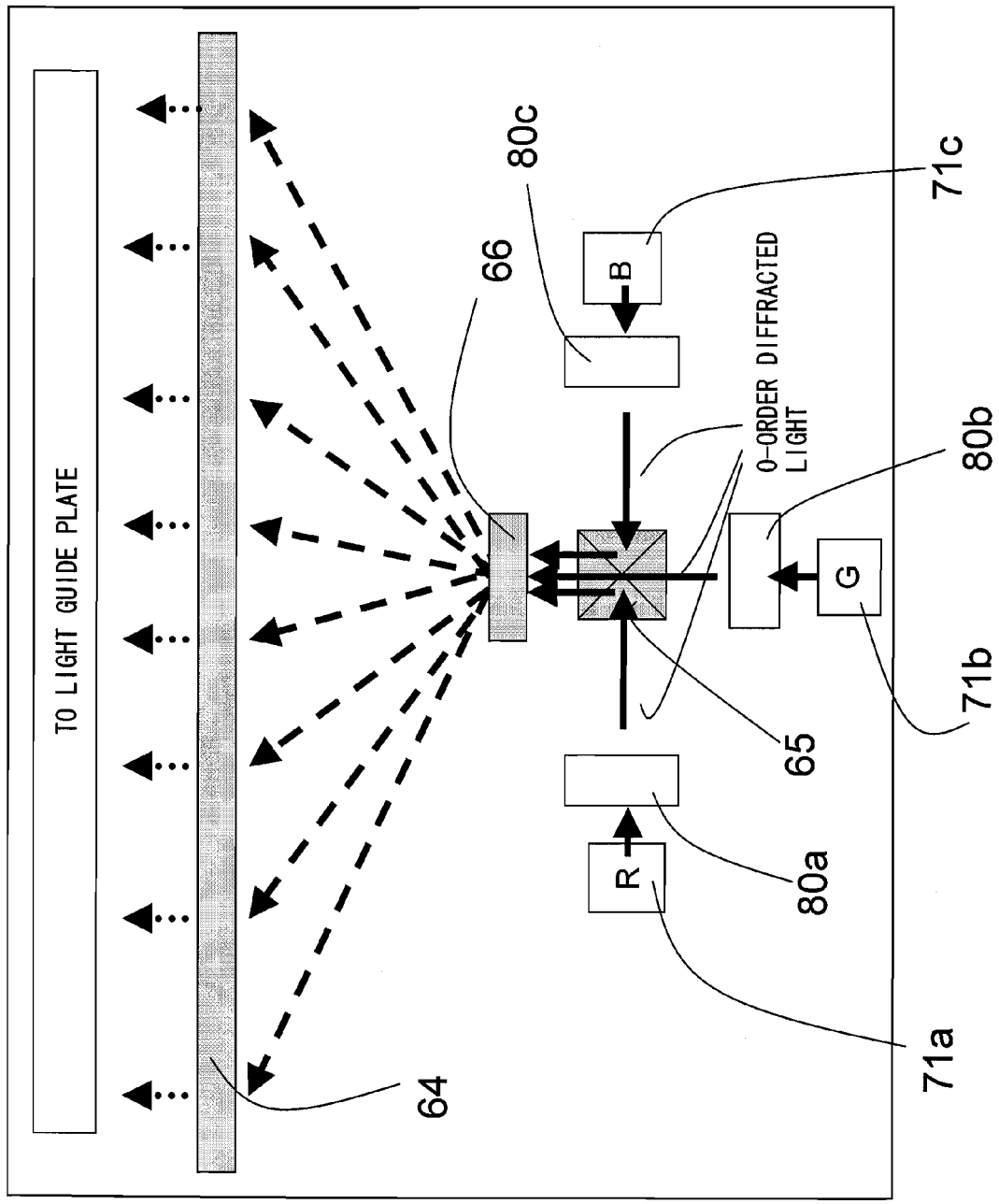
FIG. 18 is a schematic diagram showing an example structure of an image display device according to a sixth embodiment of the present invention.

FIG. 18 is a schematic diagram showing an example structure of an image display device according to a sixth embodiment of the present invention. The image display device shown in FIG. 18 takes a liquid crystal display as the example structure. Referring to FIG. 18, the image display device uses the wavelength stabilization laser device according to the fifth embodiment as at least one light source of a liquid crystal backlight. In this example: a red-laser wavelength stabilization laser device includes a red laser light source 71a and a wavelength detector 80a; a green-laser wavelength stabilization laser device includes a green laser light source 71b and a wavelength detector 80b; and a blue-laser wavelength stabilization laser device includes a blue laser light source 71c and a wavelength detector 80c.

That is, the red-laser wavelength stabilization laser device controls, by causing the wavelength detector 80a to detect the wavelength of a laser light emerging from the red laser light source 71a, the wavelength to be constant. Further, the green-laser wavelength stabilization laser device controls, by causing the wavelength detector 80b to detect the wavelength of a laser light emerging from the green laser light source 71b, the wavelength to be constant. Furthermore, the blue-laser wavelength stabilization laser device controls, by causing the wavelength detector 80c to detect the wavelength of a laser light emerging from the blue laser light source 71c, the wavelength to be constant.

0-order diffracted lights passing through the wavelength detectors 80a, 80b, and 80c are incident on a cross prism 65, the resultant laser lights are expanded by a line diffuser 66, and then the expanded laser lights pass through a Fresnel lens 64 and are incident on a light guide plate. That is, the 0-order diffracted lights emerging from the laser light sources 71a, 71b, and 71c are used as the laser lights outputted from the laser light sources.

Note that it is preferable that the image display device of the present invention uses the wavelength detector 13 according to the third embodiment as each of the wavelength detectors 80a, 80b, and 80c. The reason is that the wavelength detector 13 according to the third embodiment can concurrently measure the wavelength of the laser light and the laser power. Further, it is preferable that the wavelength detectors 80a, 80b, and 80c are provided at stages after the beam shapes of the laser lights emerging from the laser light sources 71a, 71b, and 71c are formed into rectangles, respectively.

Further, since a red laser is characterized in having a variable wavelength, it is particularly effective to use the wavelength stabilization laser device of the present invention as the light source of the red laser.

As described above, the image display device according to the sixth embodiment of the present invention can prevent white from changing by using the wavelength stabilization laser device to stabilize the wavelength of a laser light, and thus can display an image of which the color tone does not change and which is sharp.

SEVENTH EMBODIMENT

Figure 19:
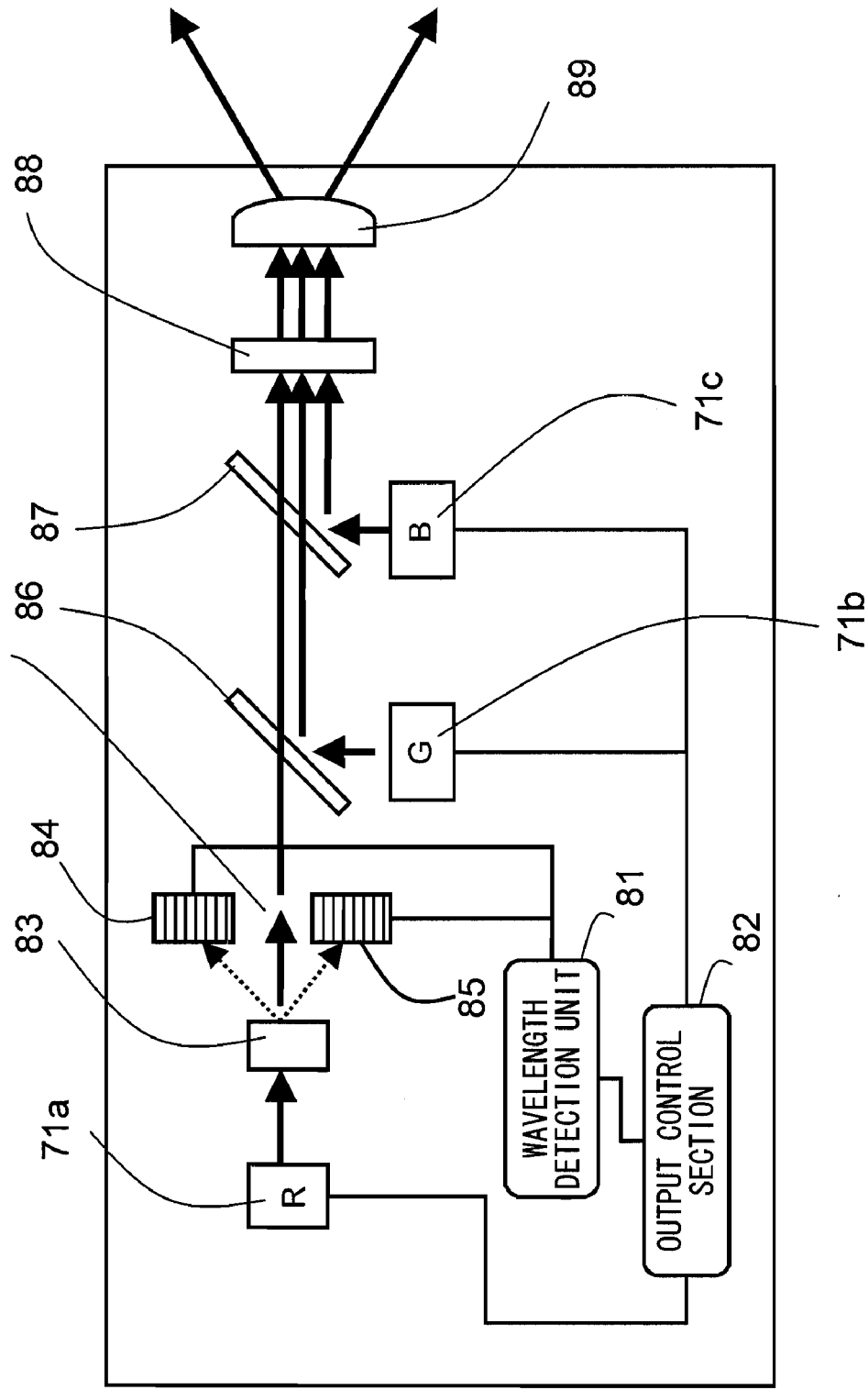
FIG. 19 is a schematic diagram showing an example structure of an image display device according to a seventh embodiment of the present invention.

FIG. 19 is a schematic diagram showing an example structure of an image display device according to a seventh embodiment of the present invention. The image display device shown in FIG. 19 takes a projector as the example structure. Referring to FIG. 19, the image display device includes a red laser light source 71a, a green laser light source 71b, a blue laser light source 71c, a wavelength detection unit 81, an output control section 82, a diffraction grating 83, photodetectors 84 and 85, dichroic mirrors 86 and 87, a spatial light modulator 88, and a projection lens 89.

In the present embodiment, a structure including the wavelength detection unit 81, the diffraction grating 83, and the photodetectors 84 and 85 corresponds to any one of the above-described wavelength detectors according to the first through fourth embodiments. Further, a structure including the above structure of the wavelength detector, the red laser light source 71a, and the output control section 82 corresponds to a wavelength stabilization laser device used as the light source of the red laser. The wavelength stabilization laser device uses the output control section 82 to control the output power of the red laser light source 71a in accordance with the change of the wavelength of a laser light detected by the wavelength detector.

A 0-order diffracted light emerging from the red laser light source 71a and diffracted by the diffraction grating 83, a laser light emerging from the green laser light source 71b, and a laser light emerging from the blue laser light source 71c illuminate the outside of the image display device through the dichroic mirrors 86 and 87, the spatial light modulator 88, and the projection lens 89.

Figure 20:
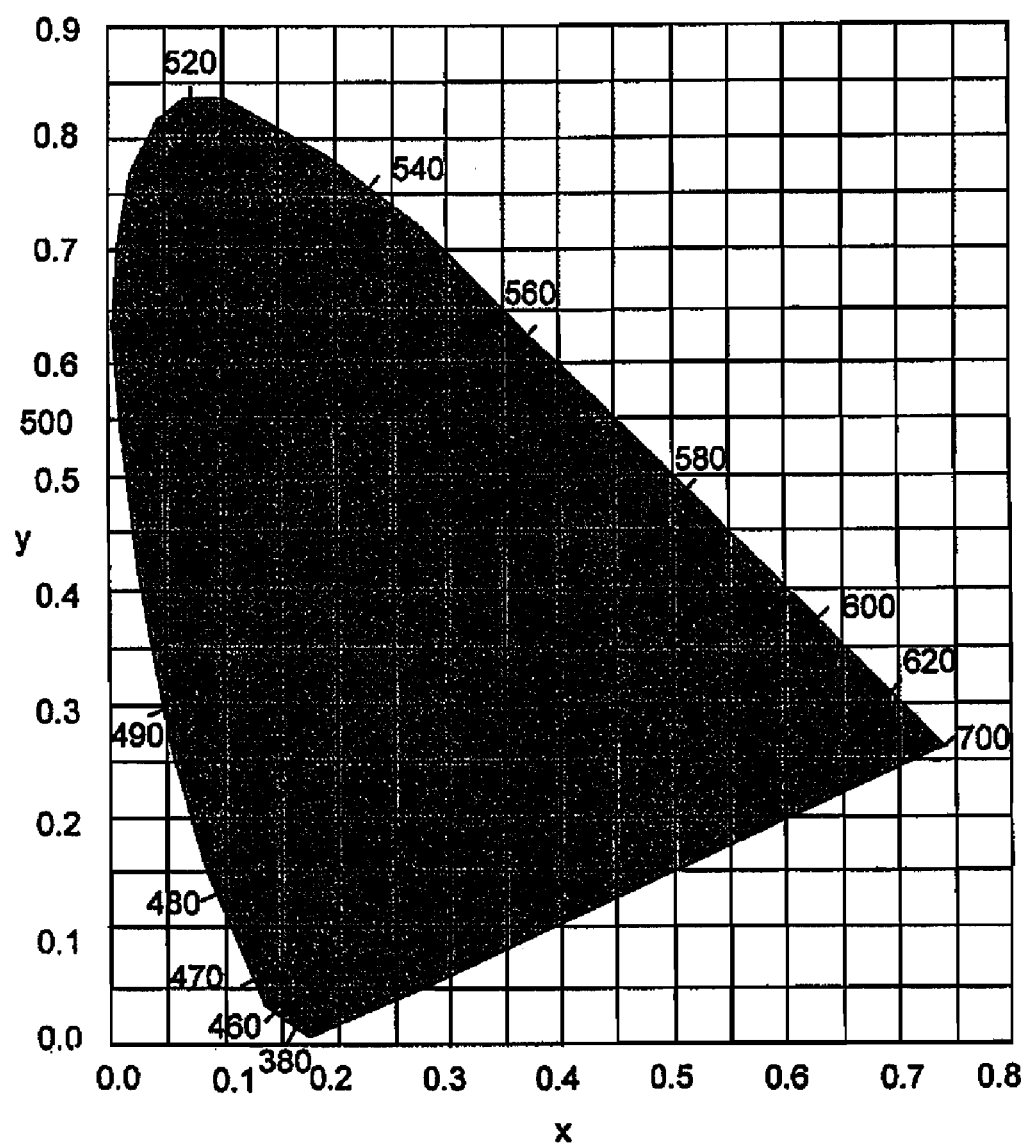
FIG. 20 is a CIE chromaticity diagram.
Figure 21:
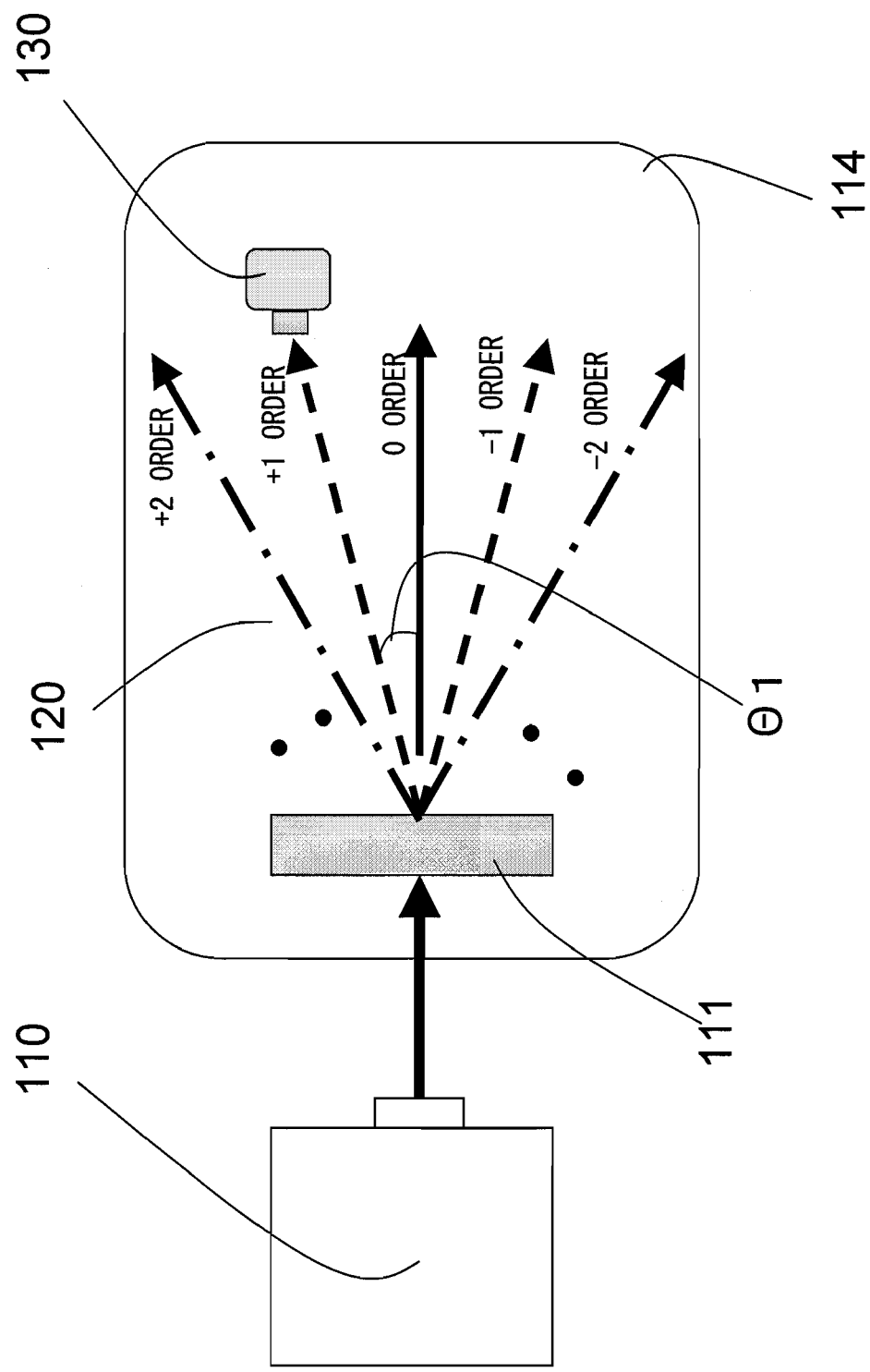
FIG. 21 is a schematic diagram showing a structure of a conventional wavelength detector 114.

Next, the reason that the output power of the red laser light source 71a is to be controlled will be described. When a projector, a display, or the like is realized using RGB laser lights as light sources, it is required to adjust the ratio of the laser power of RGB to a certain ratio to represent white. Here, the ratio of the laser power of R, G, and B is represented as r:g:b. The values of r, g, and b are determined based on the wavelengths of the RGB laser lights, respectively. With reference to a CIE chromaticity diagram shown in FIG. 20, the determination will be described. The CIE chromaticity diagram is a diagram representing colors by two-dimensional coordinates (x, y). In FIG. 20, the outermost line associates the change of a wavelength with the change of a color. When a plurality of wavelengths are present, e.g., when three colors RGB are present as in a display, a color is determined by making a composite of the three colors RGB.

White is generally represented by the color temperature of a black body. That is, white is a light emitted when the black body reaches a certain temperature, and 6500 K and 9000 K are used as the color temperatures of white. In the CIE chromaticity diagram, 6500 K is (x, y)=(0.314, 0.324) and 9000 K is (x, y)=(0.287, 0.296). On the other hand, when the wavelengths of the RGB laser lights are R: 638 nm, G: 532 nm, and B: 448 nm, respectively, the color coordinates of the RGB laser lights are:

R (x, y)=(0.704, 0.296)

G (x, y)=(0.222, 0.756)

B (x, y)=(0.153, 0.033)

Here, in the case of adjusting the color temperature of white to 6500 K, it is sufficient that the color temperature of a composite of the three colors RGB is (x, y)=(0.314, 0.324) of 6500 K. When r=1, the unknowns are g and b. Thus, equations can be obtained for x=0.314 and y=0.324 of 6500 K, whereby it is possible to obtain g and b by simultaneous equations of two unknowns and two equations. As a result of the calculation, r:g:b=1.00:0.79:0.66.

Here, consider the case where the wavelength of the R laser light changes. For example, when the wavelength changes by 2 nm and becomes 640 nm, the color coordinates are R' (x, y)=(0.706, 0.294). As a result of performing the above-described calculation for these color coordinates, r:g:b=1.00: 0.72:0.60. A table of predetermined output ratio may be prepared for the above-described change of the wavelength and thus power ratio may be controlled in each case in accordance with the change of the wavelength, whereby it is possible to realize an image display device in which white does not change.

While the invention has been described in detail, the foregoing description is in all aspects illustrative and not restrictive. It is understood that numerous other modifications and variations can be devised without departing from the scope of the invention.

What is claimed is:

1. A wavelength detector for detecting a change of a wavelength of a laser light emerging from a laser light source, the wavelength detector comprising:
   a diffraction grating for diffracting the laser light; and
   two photodetectors positioned symmetrically with respect to a 0-order diffracted laser light diffracted by the diffraction grating and for respectively measuring light intensities of the diffracted laser light,
   wherein the wavelength detector detects the change of the wavelength of the laser light based on respective light intensities of ±n-order diffracted laser lights respectively measured by the two photodetectors, n being an integer that is equal to or greater than 1.

2. The wavelength detector according to claim 1, wherein the two photodetectors respectively measure ±1-order diffracted laser lights.

3. The wavelength detector according to claim 1,
   wherein the two photodetectors respectively measure diffraction angles of the ±n-order diffracted laser lights with respect to the 0-order diffracted laser light by moving to respective positions for maximizing the respective light intensities of the ±n-order diffracted laser lights, and
   wherein the wavelength detector detects the change of the wavelength of the laser light based on an average angle of the diffraction angles of the ±n-order diffracted laser lights respectively measured by the two photodetectors.

4. The wavelength detector according to claim 1,
   wherein a respective light incidence surface of each of the two photodetectors is divided into a respective light incidence area and a respective light blocking area by a respective mask for blocking lights,
   wherein each respective light incidence area has a shape that (i) is symmetrical with respect to a straight line that is orthogonal to the 0-order diffracted laser light and that passes through the respective light incidence surfaces of the two photodetectors and (ii) includes a certain slope with respect to the straight line, and
   wherein the wavelength detector detects the change of the wavelength of the laser light based on a difference value between the respective light intensities respectively measured by the two photodetectors.

5. The wavelength detector according to claim 4, wherein the respective wavelength masks provided on the respective light incidence surfaces of the two photodetectors are movable, such that respective areas of the respective light incidence areas change in accordance with respective beam shapes of the ±n-order diffracted laser lights.

6. The wavelength detector according to claim 1, further comprising lenses, each of the lenses being respectively located in front of a respective photodetector of the two photodetectors, the lenses being for increasing respective beam diameters of the ±n-order diffracted laser lights.

7. The wavelength detector according to claim 1,
   wherein respective light incidence surfaces of the two photodetectors have a same shape and are each divided into a plurality of areas, and
   wherein the wavelength detector detects the change of the wavelength of the laser light based on a value obtained by dividing a difference value between (i) a sum of light intensities measured by all of the plurality of divided areas of one photodetector of the two photodetectors and (ii) a sum of light intensities measured by all of the plurality of divided areas of another photodetector of the two photodetectors, by a sum of light intensities measured by all of the plurality of divided areas of the two photodetectors.

8. The wavelength detector according to claim 7, wherein each respective light incidence surface of the two photodetectors is divided into a shape that (i) is symmetrical with respect to a straight line that is orthogonal to the 0-order diffracted laser light and (ii) includes a certain slope with respect to the straight line.

9. The wavelength detector according to claim 7, wherein respective beam shapes of the ±n-order diffracted laser lights are rectangular.

10. A wavelength stabilization laser device including:
    a laser light source for generating a laser light;
    the wavelength detector according to claim 1 for detecting a change of a wavelength of the laser light generated by the laser light source; and
    a wavelength control device for controlling the laser light source based on the change of the wavelength detected by the wavelength detector.

11. The wavelength stabilization laser device according to claim 10, wherein the wavelength control device controls a temperature of the laser light source such that the wavelength of the laser light is constant.

12. The wavelength stabilization laser device according to claim 10, wherein the wavelength control device controls an output from the laser light source such that the wavelength of the laser light is constant.

13. An image display device including the wavelength stabilization laser device according to claim 10 as at least one light source.

14. An image display device using a laser light as a light source, the image display device comprising the wavelength detector according to claim 1 as at least one light source,
    wherein the image display device controls, in accordance with the wavelength of the laser light detected by the wavelength detector, power of the laser light so as to prevent a color tone of an image displayed by the image display device from changing.

* * * * *